(12) United States Patent
Hikosaka

(10) Patent No.: US 10,551,645 B2
(45) Date of Patent: Feb. 4, 2020

(54) WAVEGUIDE ELEMENT, LIGHT-EMITTING DEVICE, AND METHOD FOR MANUFACTURING WAVEGUIDE ELEMENT

(71) Applicant: Kabushiki Kaisha Toshiba, Minato-ku (JP)

(72) Inventor: Toshiki Hikosaka, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/902,379

(22) Filed: Feb. 22, 2018

(65) Prior Publication Data

US 2018/0329236 A1    Nov. 15, 2018

(30) Foreign Application Priority Data

May 15, 2017  (JP) .................. 2017-096573

(51) Int. Cl.
| | | |
|---|---|---|
| *G02F 1/035* | (2006.01) | |
| *G02F 1/295* | (2006.01) | |
| *G02B 6/10* | (2006.01) | |
| *G02B 6/12* | (2006.01) | |
| *H01L 29/20* | (2006.01) | |
| *G02F 1/03* | (2006.01) | |
| *G02B 6/30* | (2006.01) | |

(52) U.S. Cl.
CPC .............. *G02F 1/035* (2013.01); *G02B 6/12* (2013.01); *G02B 6/30* (2013.01); *G02F 1/0316* (2013.01); *H01L 29/2003* (2013.01); *G02B 2006/12166* (2013.01); *G02F 2201/07* (2013.01)

(58) Field of Classification Search
CPC .... G02F 1/035; G02F 1/0316; G02F 2201/07; H01L 29/2003; G02B 6/12; G02B 6/30; G02B 2006/12166
USPC ...................... 385/2, 8, 9, 129–132
See application file for complete search history.

(56) References Cited

U.S. PATENT DOCUMENTS

| | | | | |
|---|---|---|---|---|
| 5,972,730 A | * | 10/1999 | Saito ..................... | H01S 5/0201 372/45.01 |
| 7,411,988 B2 | * | 8/2008 | Tanaka .................... | H01S 5/16 372/43.01 |
| 7,773,648 B2 | * | 8/2010 | Tachibana .............. | B82Y 20/00 372/43.01 |

(Continued)

FOREIGN PATENT DOCUMENTS

| | | |
|---|---|---|
| JP | 4-81725 | 3/1992 |
| JP | 6-82863 | 3/1994 |
| WO | WO 2006/114999 A1 | 11/2006 |

*Primary Examiner* — Kaveh C Kianni
*Assistant Examiner* — Hung Q Lam
(74) *Attorney, Agent, or Firm* — Oblon, McClelland, Maier & Neustadt, L.L.P.

(57) ABSTRACT

According to one embodiment, a waveguide element includes a first crystal region, and a second crystal region. The first crystal region extends in a first direction and includes a first nitride semiconductor. The second crystal region extends in the first direction, includes a second nitride semiconductor, and is continuous with the first crystal region. A second direction crosses the first direction. The second direction is from the first crystal region toward the second crystal region. A <0001> direction of the first crystal region is from the first crystal region toward the second crystal region. A <0001> direction of the second crystal region is from the second crystal region toward the first crystal region.

19 Claims, 9 Drawing Sheets

(56) References Cited

U.S. PATENT DOCUMENTS

| | | | |
|---|---|---|---|
| 7,808,007 B2* | 10/2010 | Otsuka | H01L 33/505 257/80 |
| 2009/0072243 A1 | 3/2009 | Suda et al. | |
| 2014/0167066 A1* | 6/2014 | Kashima | H01L 33/20 257/76 |

* cited by examiner

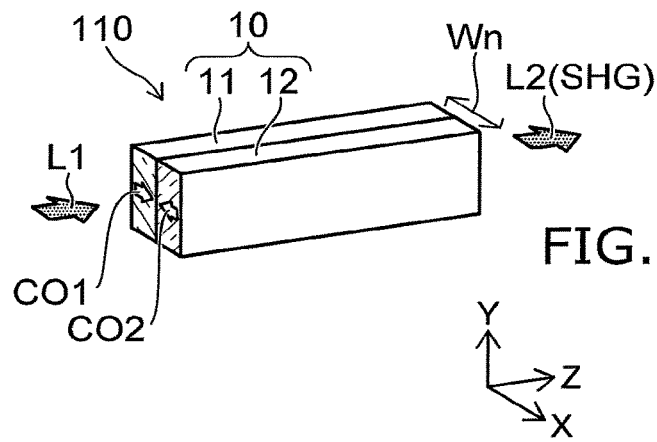
FIG. 6A
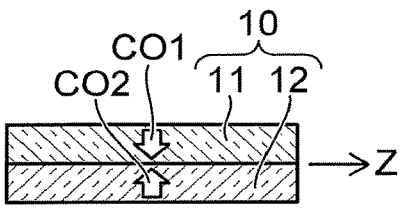
FIG. 6C
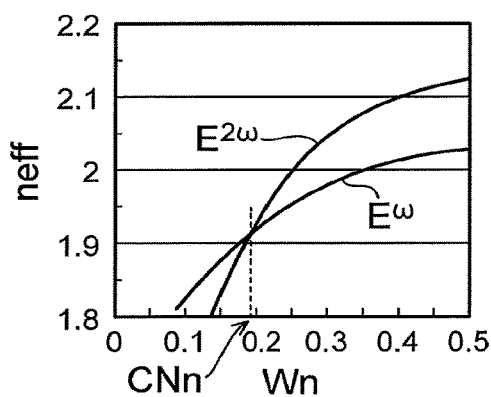
FIG. 6B
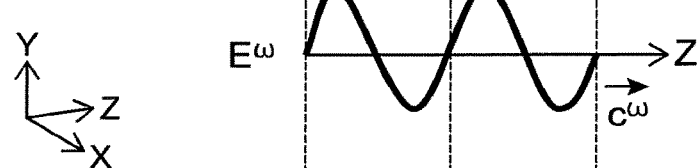
FIG. 6D
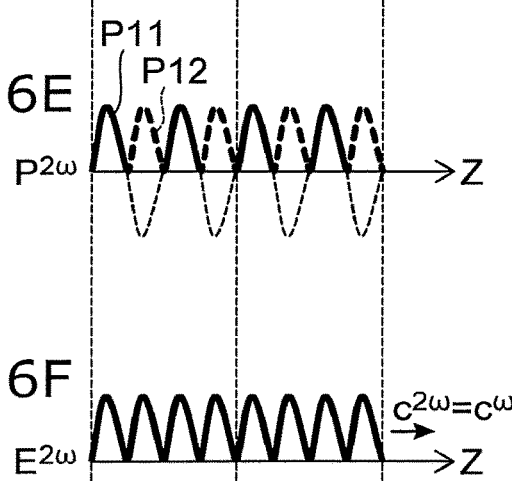
FIG. 6E
FIG. 6F
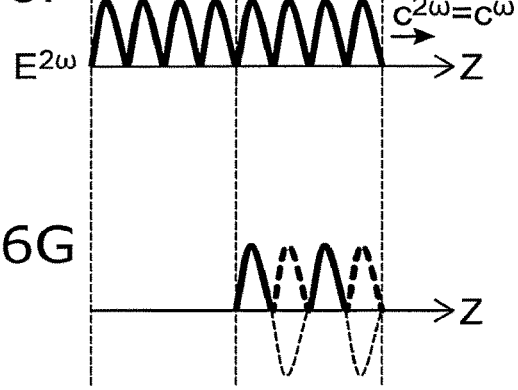
FIG. 6G

WAVEGUIDE ELEMENT, LIGHT-EMITTING DEVICE, AND METHOD FOR MANUFACTURING WAVEGUIDE ELEMENT

CROSS-REFERENCE TO RELATED APPLICATIONS

This application is based upon and claims the benefit of priority from Japanese Patent Application No. 2017-096573, filed on May 15, 2017; the entire contents of which are incorporated herein by reference.

FIELD

Embodiments described herein relate generally to a waveguide element, a light-emitting device, and a method for a manufacturing the waveguide element.

BACKGROUND

A waveguide element that includes two or more optical waveguides has been proposed. For example, the nonlinear polarizations of the two or more optical waveguides are reversed. The wavelength of the incident light can be converted by the waveguide element. It is desirable to increase the wavelength conversion efficiency of the waveguide element.

BRIEF DESCRIPTION OF THE DRAWINGS

FIG. 6A to FIG. 6G are schematic views illustrating the waveguide element according to the embodiment;

DETAILED DESCRIPTION

Figure 1A:
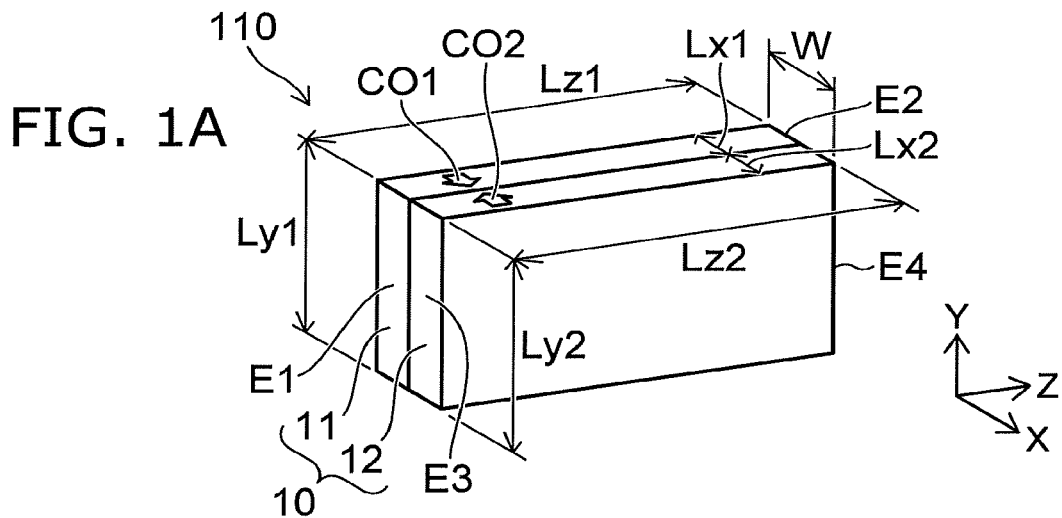
FIG. 1A to FIG. 1C are schematic views illustrating a waveguide element according to a first embodiment.

According to one embodiment, a waveguide element includes a first crystal region, and a second crystal region. The first crystal region extends in a first direction and includes a first nitride semiconductor. The second crystal region extends in the first direction, includes a second nitride semiconductor, and is continuous with the first crystal region. A second direction crosses the first direction. The second direction is from the first crystal region toward the second crystal region. A <0001> direction of the first crystal region is from the first crystal region toward the second crystal region. A <0001> direction of the second crystal region is from the second crystal region toward the first crystal region.

According to another embodiment, a light-emitting device includes the waveguide element described above, and a light source portion emitting a first light of a first wavelength. The first crystal region includes a first end portion and a second end portion, and a direction from the first end portion toward the second end portion is aligned with the first direction. The second crystal region includes a third end portion and a fourth end portion, and a direction from the third end portion toward the fourth end portion is aligned with the first direction. The first light is incident on the first end portion and the third end portion. A second wavelength of a second light emitted from the second end portion and the fourth end portion is different from the first wavelength.

According to another embodiment, a method for manufacturing a waveguide element is disclosed. The method can include preparing a first layer having a recess and being crystalline. The recess extends in a first direction and has a first side surface and a second side surface opposing each other in a second direction crossing the first direction. The method can include growing a first crystal layer from the first side surface and growing a second crystal layer from the second side surface. The first crystal layer includes a nitride semiconductor. The second crystal layer includes a nitride semiconductor. The method can include forming a first crystal region and a second crystal region by causing the first crystal layer and the second crystal layer to contact each other. The first crystal region includes the first crystal layer. The second crystal region includes the second crystal layer.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
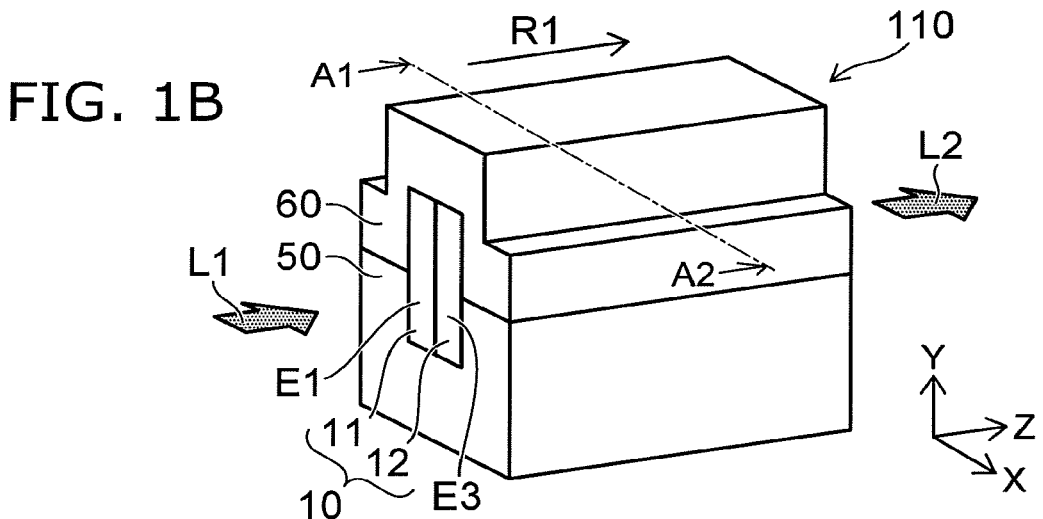
Figure 1C:
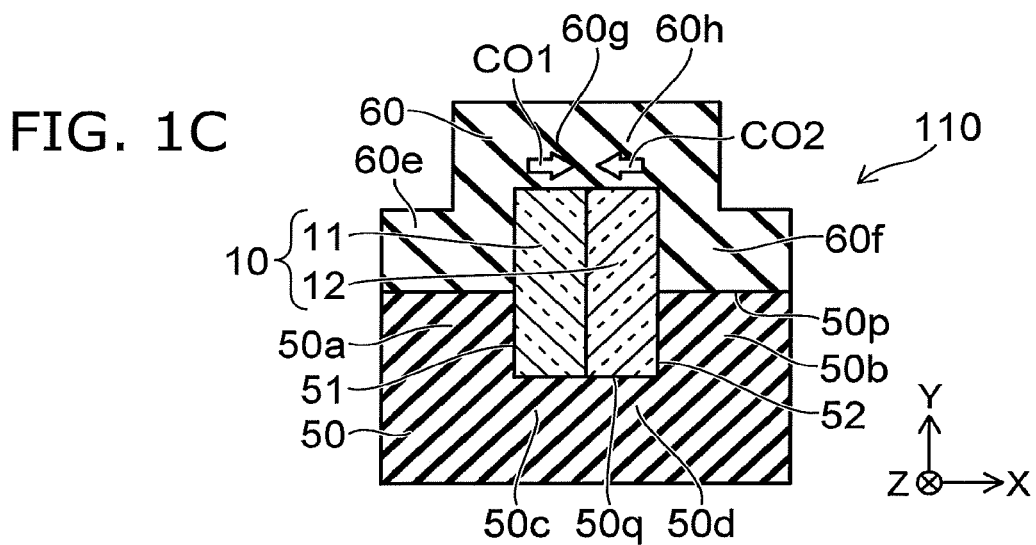

FIG. 1A to FIG. 1C are schematic views illustrating a waveguide element according to a first embodiment.

FIG. 1A and FIG. 1B are perspective views. FIG. 1C is a line A1-A2 cross-sectional view of FIG. 1B.

As shown in FIG. 1A, the waveguide element 110 according to the embodiment includes a first crystal region 11 and a second crystal region 12. The first crystal region 11 and the second crystal region 12 extend along a first direction. The first crystal region 11 and the second crystal region 12 are included in a waveguide 10.

The first direction is taken as a Z-axis direction. One direction perpendicular to the Z-axis direction is taken as an X-axis direction. A direction perpendicular to the Z-axis direction and the X-axis direction is taken as a Y-axis direction.

The first crystal region 11 includes a first end portion E1 and a second end portion E2. The direction from the first end portion E1 toward the second end portion E2 is aligned with the first direction (the Z-axis direction). The first crystal region 11 includes a first nitride semiconductor.

The second crystal region 12 includes a third end portion E3 and a fourth end portion E4. The direction from the third end portion E3 toward the fourth end portion E4 is aligned with the first direction (the Z-axis direction). The second crystal region 12 includes a second nitride semiconductor. For example, the second crystal region 12 is continuous with the first crystal region 11. For example, the second crystal region 12 contacts the first crystal region 11. For example, the second crystal region 12 is optically coupled with the first crystal region 11. There may be cases where the boundary between the first crystal region 11 and the second crystal region 12 can be observed and cases where the boundary cannot be observed.

A second direction from the first crystal region 11 toward the second crystal region 12 crosses the first direction. The second direction is perpendicular to the first direction. The second direction is, for example, the X-axis direction.

A length Lz1 along the first direction of the first crystal region 11 is longer than a length Lx1 along the second direction of the first crystal region 11. A length Lz2 along the first direction of the second crystal region 12 is longer than a length Lx2 along the second direction of the second crystal region 12.

A direction crossing a plane (e.g., the X-Z plane) including the first direction and the second direction is taken as a third direction. The third direction is, for example, the Y-axis direction.

The length Lz1 along the first direction of the first crystal region 11 is longer than a length Ly1 along the third direction of the first crystal region 11. The length Lz2 along the first direction of the second crystal region 12 is longer than a length Ly2 along the third direction of the second crystal region 12. In the example, the length Ly1 is longer than the length Lx1. The length Ly2 is longer than the length Lx2.

For example, the length Lz1 is substantially the same as the length Lz2. The length Lz1 is not less than 0.95 times and not more than 1.05 times the length Lz2. For example, the length Ly1 is substantially the same as the length Ly2. The length Ly1 is not less than 0.95 times and not more than 1.05 times the length Ly2. For example, the length Lx1 may be substantially the same as the length Lx2 or may be different. For example, the length Lx1 may be not less than 0.95 times and not more than 1.05 times the length Lx2.

The sum of the length Lx1 and the length Lx2 corresponds to a width W of the waveguide 10.

The first crystal region 11 and the second crystal region 12 include, for example, gallium nitride (GaN). The first crystal region 11 and the second crystal region 12 may include, for example, $Al_{x1}Ga_{1-x1}N (0 \leq x1 < 1)$. The first crystal region 11 and the second crystal region 12 may include, for example, $Al_{x1}Ga_{1-x1}N (0 \leq x1 \leq 1)$.

As shown in FIG. 1B, a first layer 50 is further provided in the example. The first layer 50 is, for example, a base body (or a substrate).

As shown in FIG. 1C, a recess 50q (e.g., a trench) and a protrusion 50p are provided in the first layer 50. At least a portion of the waveguide 10 is provided inside the recess 50q.

The first layer 50 includes, for example, a first partial region 50a, a second partial region 50b, a third partial region 50c, and a fourth partial region 50d. At least a portion of the first crystal region 11 is positioned between the first partial region 50a and the second partial region 50b in the second direction (the X-axis direction). At least a portion of the second crystal region 12 is positioned between the second partial region 50b and the at least a portion of the first crystal region 11 in the second direction. The direction from the third partial region 50c toward the first crystal region 11 is aligned with the third direction (a direction crossing a plane including the first direction and the second direction, and in the example, the Y-axis direction). The direction from the fourth partial region 50d toward the second crystal region 12 is aligned with the third direction (in the example, the Y-axis direction).

The first partial region 50a, the second partial region 50b, the third partial region 50c, and the fourth partial region 50d each are continuous with one other of these regions.

The first layer 50 (the base body or the substrate) is, for example, a c-plane sapphire substrate. The first layer 50 includes at least one selected from the group consisting of aluminum oxide ($Al_2O_3$ or $AlO_x$), silicon (Si), aluminum nitride (AlN), and silicon carbide (SiC). Examples of the first layer 50 are described below.

The refractive index of the first layer 50 is lower than the refractive index of the first crystal region 11. The refractive index of the first layer 50 is lower than the refractive index of the second crystal region 12. For example, the first layer 50 may function as a clad layer.

A second layer 60 is further provided in the example. The second layer 60 includes, for example, a fifth partial region 60e, a sixth partial region 60f, a seventh partial region 60g, and an eighth partial region 60h. Another portion of the first crystal region 11 is positioned between the fifth partial region 60e and the sixth partial region 60f in the second direction (the X-axis direction). Another portion of the second crystal region 12 is positioned between the sixth partial region 60f and the other portion of the first crystal region 11 in the second direction. The direction from the first crystal region 11 toward the seventh partial region 60g is aligned with the third direction (the Y-axis direction). The direction from the second crystal region 12 toward the eighth partial region 60h is aligned with the third direction.

The refractive index of the second layer 60 is lower than the refractive index of the first crystal region 11. The refractive index of the second layer 60 is lower than the refractive index of the second crystal region 12. For example, the second layer 60 may function as a clad layer.

For example, the second layer 60 may include $Al_{x2}Ga_{1-x2}N$ ($0<x2\leq1$ and $x1<x2$) in the case where the first crystal region 11 and the second crystal region 12 include $Al_{x1}Ga_{1-x1}N(0\leq x1<1)$. For example, the second layer 60 may include at least one selected from the group consisting of silicon oxide ($SiO_x$), zinc oxide ($ZnO_x$), silicon nitride ($SiN_x$), silicon oxynitride ($SiON_x$), and aluminum oxide ($Al_2O_3$ or $AlO_x$).

A first light L1 enters from the first end portion E1 of the first crystal region 11 and the third end portion E3 of the second crystal region 12. The first light L1 propagates through these crystal regions. A propagation direction R1 (referring to FIG. 1B) is aligned with the Z-axis direction. A second light L2 is emitted from the second end portion E2 of the first crystal region 11 and the fourth end portion E4 of the second crystal region 12. A second wavelength of the second light L2 is different from a first wavelength of the first light L1. Wavelength conversion is performed by the waveguide element 110.

Because the refractive index of the first layer 50 and the refractive index of the second layer 60 each are lower than the refractive index of the waveguide 10, the light propagates efficiently through the waveguide 10 (the first crystal region 11 and the second crystal region 12). The second layer 60 may be omitted; and there may be a gas (e.g., air, etc.) around the other portion of the first crystal region 11 recited above and the other portion of the second crystal region 12 recited above. There may be a depressurized space around these crystal regions. Even in such a case, the light propagates efficiently through the waveguide 10 (the first crystal region 11 and the second crystal region 12).

As shown in FIG. 1A and FIG. 1C, the first crystal region 11 has a first orientation CO1 of the polarity. The second crystal region 12 has a second orientation CO2 of the polarity. The first orientation CO1 has a reverse component of the second orientation CO2. For example, the first orientation CO1 is the reverse of the second orientation CO2.

For example, the first orientation CO1 of the polarity of the first crystal region 11 is from the first crystal region 11 toward the second crystal region 12. For example, the second orientation CO2 of the polarity of the second crystal region 12 is from the second crystal region 12 toward the first crystal region 11.

For example, the first crystal region 11 and the second crystal region 12 have hexagonal crystal structures. The first orientation CO1 of the polarity of the first crystal region 11 corresponds to the <0001> direction of the first crystal region 11. The second orientation CO2 of the polarity of the second crystal region 12 corresponds to the <0001> direction of the second crystal region 12. The <0001> direction of the first crystal region 11 is from the first crystal region 11 toward the second crystal region 12. The <0001> direction of the second crystal region 12 is from the second crystal region 12 toward the first crystal region 11. The <0001> direction of the first crystal region 11 is the +X direction. The <0001> direction of the second crystal region 12 is the −X direction.

For example, the first direction (the Z-axis direction) is aligned with the m-axis direction of the first crystal region 11 and aligned with the m-axis direction of the second crystal region 12.

By such a waveguide element 110, a high wavelength conversion efficiency is obtained. A high efficiency is obtained. For example, the orientations of the polarities of the crystals in the two crystal regions are different from each other. Thereby, the phases are matched for the light incident on the waveguide element 110. For example, the overlap integral of the electric field component ($TE_0^\omega$) of the fundamental and the electric field component ($TE_1^{2\omega}$) of the second harmonic can be large. The wavelength can be converted with high efficiency. Examples of the characteristics of the waveguide element 110 are described below.

In the embodiment as described above, the length Ly1 is longer than the length Lx1; and the length Ly2 is longer than the length Lx2. As described above, the width W in the X-axis direction of the waveguide 10 is the sum of the length Lx1 and the length Lx2. On the other hand, the width in the Y-axis direction of the waveguide 10 is the length Ly1 or the length Ly2. Because the length Ly1 is longer than the length Lx1 and the length Ly2 is longer than the length Lx2, the width W in the X-axis direction of the waveguide 10 can approach the width in the Y-axis direction. For example, the width W is enlarged easily. For example, it is favorable for the sum of the length (the length Lx1) along the second direction of the first crystal region 11 and the length (the length Lx2) along the second direction of the second crystal region 12 to be not less than 0.1 times and not more than 2 times the length (the length Ly1) along the third direction of the first crystal region 11. Thereby, for example, the number of times the light is reflected in the X-axis direction can be suppressed. For example, the loss in the waveguide 10 can be suppressed.

An example of a method for making the waveguide element 110 according to the embodiment will now be described. In the following example, multiple waveguides are formed in the waveguide element.

FIG. 2A to FIG. 2F are schematic cross-sectional views illustrating the method for manufacturing the waveguide element according to the first embodiment.

Figure 2A:
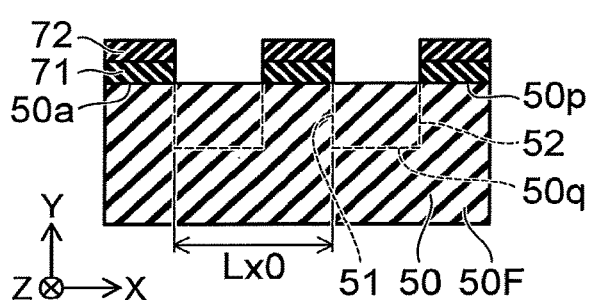
FIG. 2A to FIG. 2F are schematic cross-sectional views illustrating the method for manufacturing the waveguide element according to the first embodiment.

As shown in FIG. 2A, a film that is used to form a mask layer 71 is formed on the upper surface of a substrate 50F used to form the first layer 50; and a film that is used to form a resist layer 72 is formed on the film used to form the mask layer 71. The film that is used to form the resist layer 72 is patterned into a stripe configuration. Thereby, the resist layer 72 is formed. The resist layer 72 has a stripe configuration extending in the Z-axis direction. The film that is used to form the mask layer 71 is patterned using the resist layer 72 as a mask. Thereby, the mask layer 71 is formed. The mask layer 71 has a stripe configuration extending in the Z-axis direction. The substrate 50F is patterned using the mask layer 71 as a mask. A portion of the substrate 50F is removed; and the recess 50q (e.g., the trench) and the protrusion 50p are formed in the substrate 50F. Thereby, the first layer 50 is formed. The recess 50q (e.g., the trench) and the protrusion 50p extend along the Z-axis direction. An example of the formation of the first layer 50 (the patterning of the substrate 50F) will now be described.

For example, a c-plane sapphire substrate is used as the substrate 50F. For example, the c-plane is substantially parallel to the X-Z plane. For example, the m-axis direction of the sapphire substrate is aligned with the Z-axis direction. In other words, the recess 50q (e.g., the trench) and the protrusion 50p extend along the m-axis direction.

Silicon oxide is used as the mask layer 71. The thickness of the mask layer 71 is, for example, about 50 nm.

The length along the X-axis direction of one resist layer 72 is, for example, about 1.0 μm. The spacing (the width of the opening) along the X-axis direction between the multiple resist layers 72 is, for example, about 1.0 μm. The period of the stripes is, for example, about 2.0 μm.

For example, etching using buffered hydrogen fluoride is performed to remove a portion of the silicon oxide film (the film used to form the mask layer 71) by using the resist layer 72 as a mask. $O_2$ asher processing may be performed before the removal. Thereby, the hydrophilic property improves; and the uniformity of the etching increases. The mask layer 71 is obtained by the removal of the portion of the silicon oxide film. Subsequently, the resist layer 72 is removed.

For example, the dry etching is performed to remove a portion of the substrate 50F by using the mask layer 71 as a mask. Thereby, the multiple recesses 50q and the multiple protrusions 50p are formed. The multiple recesses 50q and the multiple protrusions 50p extend in the Z-axis direction. Thereby, the first layer 50 is obtained. The first layer 50 has a first side surface 51 and a second side surface 52. For example, these side surfaces extend in the Z-axis direction. For example, these side surfaces are aligned with the Z-Y plane. These side surfaces correspond to the a-plane of the sapphire.

Thus, the processing described in reference to FIG. 2A is performed. The mask layer 71 may be removed. Or, the mask layer 71 may remain.

Figure 2B:
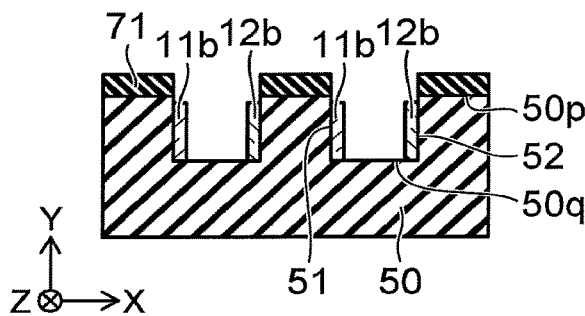

As shown in FIG. 2B, buffer layers are formed on the second side surface 52 and the first side surface 51 of the first layer 50. For example, a first buffer layer 11b is formed on the surface of the first side surface 51. A second buffer layer 12b is formed on the surface of the second side surface 52. These buffer layers are, for example, GaN.

Figure 2C:
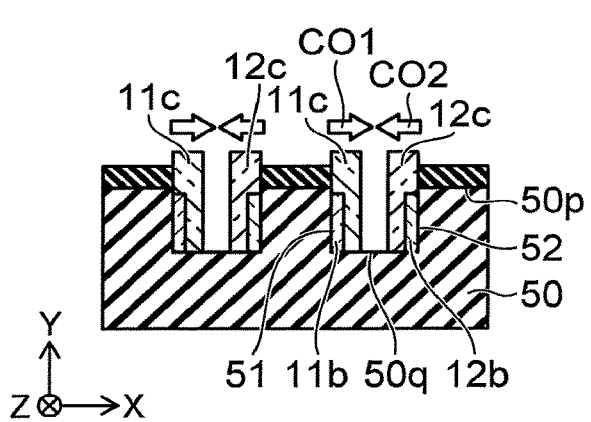

As shown in FIG. 2C, crystal layers are grown on these buffer layers. For example, a first crystal layer 11c is formed on the surface of the first buffer layer 11b. A second crystal layer 12c is formed on the surface of the second buffer layer 12b. These crystal layers are, for example, GaN. These crystal layers are selectively grown on the first side surface 51 (the first buffer layer 11b) and the second side surface 52 (the second buffer layer 12b).

The crystal layers (the first crystal layer 11c and the second crystal layer 12c) are grown from the two side surfaces (the side walls) of the recess 50q of the first layer 50 (the substrate). The <0001> direction of the first crystal layer 11c is from the first side surface 51 toward the second side surface 52. The <0001> direction of the second crystal layer 12c is from the second side surface 52 toward the first side surface 51. Thus, two GaN layers of which the c-axes face each other are formed from the two side surfaces. The first crystal layer 11c has the first orientation CO1 of the polarity. The second crystal layer 12c has the second orientation CO2 of the polarity. These orientations are the reverse of each other.

Figure 2D:
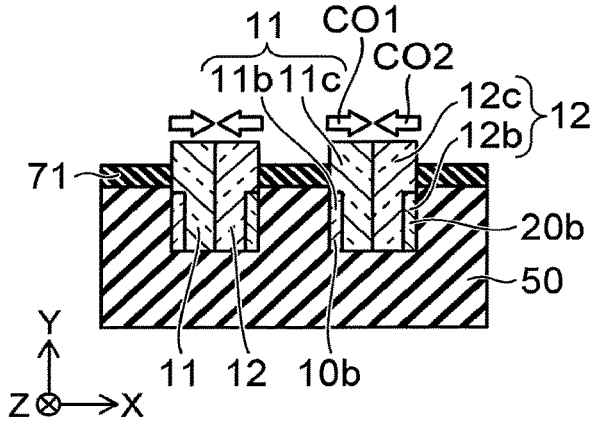

As the growth of the two crystal layers is continued as shown in FIG. 2D, the two crystal layers (the GaN layers) contact each other. The two crystal layers unite. Thereby, two GaN layers of which the directions of the c-axes are mutually-reversed are formed inside the recess 50q. At least a portion of the first crystal layer 11c is used to form the first crystal region 11. At least a portion of the second crystal layer 12c is used to form the second crystal region 12. The first crystal region 11 may include at least a portion of the first crystal layer 11c and at least a portion of the first buffer layer 11b. The second crystal region 12 may include at least a portion of the second crystal layer 12c and at least a portion of the second buffer layer 12b.

Figure 2E:
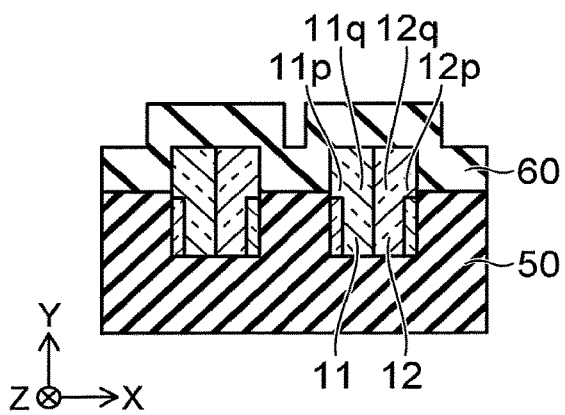

As shown in FIG. 2E, the second layer 60 is formed on the first layer 50 (the substrate), the first crystal region 11, and the second crystal region 12. The second layer 60 is, for example, AlN. The thickness of the second layer 60 is, for example, 200 nm. The second layer 60 includes, for example, a partial region overlapping the first crystal region 11. For example, the thickness of the second layer 60 corresponds to the length along the Y-axis direction of this partial region.

For example, the second layer 60 is formed by sputtering. For example, the second layer 60 may be formed by vapor deposition, ALD, CVD, etc.

In the example, the mask layer 71 is removed before the formation of the second layer 60. The mask layer 71 may remain.

Figure 2F:
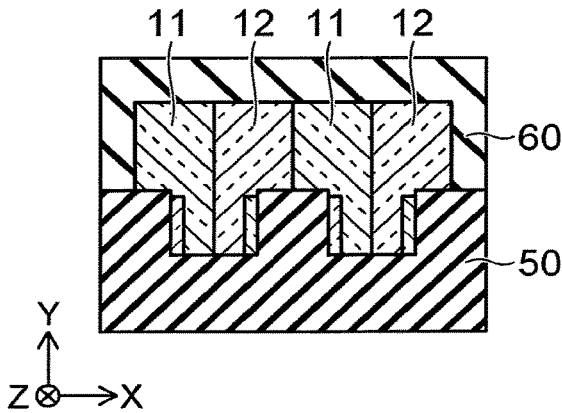

The growth of the crystal layer may be continued further in the process described in reference to FIG. 2D recited above. In such a case, as shown in FIG. 2F, the first crystal layer 11c that is grown from one recess 50q and the second crystal layer 12c that is grown from another one recess 50q contact each other. Thereby, multiple sets of the crystal layers are formed. One of the multiple sets includes two crystal layers of which the orientations of the polarities of the crystals are mutually-reversed. For example, one of the multiple second crystal regions 12 is positioned between one of the multiple first crystal regions 11 and another one of the multiple first crystal regions 11. One of the multiple first crystal regions 11 is positioned between one of the multiple second crystal regions 12 and another one of the multiple second crystal regions 12. These crystal regions contact each other. The second layer 60 is formed after the formation of such a structure.

The second layer 60 may be omitted in the example illustrated in FIG. 2E and FIG. 2F.

The buffer layers (the first buffer layer 11b and the second buffer layer 12b) and the crystal layers (the first crystal layer 11c and the second crystal layer 12c) are formed by epitaxial growth. An example of the epitaxial growth will now be described.

The recess 50q, the protrusion 50p, and the first layer 50 (the substrate) having the side surfaces are obtained by the process illustrated in FIG. 2A. The first layer 50 is processed by organic cleaning and acid cleaning. Subsequently, the first layer 50 is introduced to the reactor of a MOCVD apparatus.

Thermal cleaning of the first layer 50 (the substrate) is performed in a hydrogen atmosphere in the MOCVD apparatus. The temperature at this time is about 1100° C. Then, GaN that is used to form the buffer layers is formed using trimethylgallium (TMGa) and ammonia ($NH_3$). The thickness (the length along the X-axis direction) of the buffer layer is about 30 nm. The growth temperature (the substrate temperature) at this time is about 500° C.

Subsequently, GaN that is used to form the crystal layers is grown using TMGa and ammonia in an atmosphere including nitrogen and hydrogen. At this time, the growth temperature is about 1120° C.; the growth pressure is 100 hPa; and the V/III ratio is 300. The GaN is selectively grown from the side surfaces (the first side surface 51 and the second side surface 52) of the recess 50q of the first layer 50 (the substrate). These side surfaces correspond to the a-plane of the sapphire. The GaN substantially is not grown on the bottom surface of the recess 50q. For example, the selective growth is caused by the difference of the growth rates.

For the crystal layers (the GaN) that are grown, the c-axis directions of the GaN are substantially parallel to the major surface of the substrate (the X-Z plane).

In the initial stage of the growth of the GaN used to form the crystal layers, the GaN layers (the crystal layers) extend along the Z-axis direction. As the growth time lengthens, the opposing two crystal layers contact each other in the recess 50q of the substrate. At this time, the upper surfaces (the surfaces aligned with the X-Z plane) of the GaN layers are the (11-20) plane. By further continuing the crystal growth, the structure illustrated in FIG. 2F is formed.

The second layer 60 may be formed in a MOCVD apparatus. For example, in the case where the second layer 60 is AlN, for example, the second layer 60 can be formed using trimethyl aluminum (TMAl) and ammonia ($NH_3$). At this time, the growth temperature is about 1120° C.; the growth pressure is 100 hPa; and the V/III ratio is 100.

For example, in the case where the second layer 60 is aluminum oxide, for example, the second layer 60 can be formed using trimethylgallium (TMAl) and oxygen ($O_2$) in a nitrogen atmosphere. At this time, the growth temperature is about 1100° C.; and the growth pressure is 100 hPa.

After the crystal growth recited above, the temperature is reduced to room temperature. Thereby, the first crystal region 11 and the second crystal region 12 are formed.

As recited above, the materials of the two crystal layers are substantially the same because the two crystal layers are grown respectively from the first side surface 51 and the second side surface 52 of one recess 50q. Thereby, other than the crystal orientations, the characteristics of the two crystal regions (the first crystal region 11 and the second crystal region 12) are substantially the same. Thereby, high homogeneity of the waveguide 10 (the first crystal region 11 and the second crystal region 12) is obtained.

The thicknesses of the two crystal layers are substantially the same because the two crystal layers are grown respectively from the first side surface 51 and the second side surface 52 of one recess 50q. For example, the length Lx1 along the second direction (the X-axis direction) of the first crystal region 11 is not less than 0.9 times and not more than 1.1 times the length Lx2 along the second direction of the second crystal region 12. The length Lx1 may be not less than 0.95 times and not more than 1.05 times the length Lx2. By setting these lengths (thicknesses) of the two crystal regions to be substantially the same, for example, the overlap integral of the electric field component ($TE_0^\omega$) of the fundamental and the electric field component ($TE_1^{2\omega}$) of the second harmonic can be large; and a higher efficiency is obtained.

In the waveguide element 110 as recited above, for example, the two crystal layers are grown from the two side surfaces of the recess 50q. Therefore, compared to the portions that are formed in the initial stage of the growth, the crystal quality can be higher for the portions formed in the latter stage of the growth. For example, the dislocation density can be small.

For example, the first crystal region 11 includes a first portion 11p and a second portion 11q (referring to FIG. 2E). The second portion 11q is positioned between the first portion 11p and the second crystal region 12. The dislocation density of the second portion 11q is lower than the dislocation density of the first portion 11p.

For example, the second crystal region 12 includes a third portion 12p and a fourth portion 12q (referring to FIG. 2E). The fourth portion 12q is positioned between the third portion 12p and the first crystal region 11. The dislocation density of the fourth portion 12q is lower than the dislocation density of the third portion 12p.

In the first crystal region 11 and the second crystal region 12, the dislocation densities are low in the mutually-proximal regions of the first crystal region 11 and the second crystal region 12; therefore, the loss of the light passing through these regions can be low. A higher efficiency is obtained.

Examples of characteristics of the waveguide element 110 according to the embodiment will now be described. In the examples below, the first crystal region 11 and the second crystal region 12 are GaN. The <0001> direction of the first crystal region 11 and the <0001> direction of the second crystal region 12 are parallel to the X-axis direction. The <0001> direction of the first crystal region 11 is from the first crystal region 11 toward the second crystal region 12. The <0001> direction of the second crystal region 12 is from the second crystal region 12 toward the first crystal region 11. The first layer 50 is a c-plane sapphire substrate. The second layer 60 is AlN. The length Lx1 is the same as the length Lx2. The simulation results of the characteristics when changing the width W of the waveguide 10 (referring to FIGS. 1A to 1C) will now be described. In the simulation, the length Lz1 and the length Lz2 each are 1 mm. The length Ly1 and the length Ly2 each are 2 μm. For such a waveguide 10, the first light (the incident light) is incident on the first end portion E1 and the third end portion E3 and propagates through the waveguide 10. The incident light is laser light (coherent light).

An intensity I of the second harmonic of the waveguide 10 is represented by the following formula.

$$I \propto \frac{\sin^2(\Delta kz/2)}{(\Delta kz/2)^2} \times \left\{ \int_{-\infty}^{\infty} d(y) \cdot E_{2\omega}(y) \cdot [E_\omega(y)]^2 dy \right\}^2 \quad \text{[Formula 1]}$$

In the formula recited above, the term of $\sin^2(\Delta kz/2)/(\Delta kz/2)^2$ is the phase matching factor of the propagation direction. $\Delta k$ is the wave number vector mismatch. In the formula recited above, d(y) is the nonlinear optical constant. In the formula recited above, $E_{2\omega}(y)$ is the second harmonic. In the formula recited above, $E_\omega(y)$ is the fundamental.

Based on the formula recited above, the characteristics of the light propagating through the waveguide 10 are determined by simulation calculations. Examples of the simulation results of the characteristics of the light will now be described.

Figure 3A:
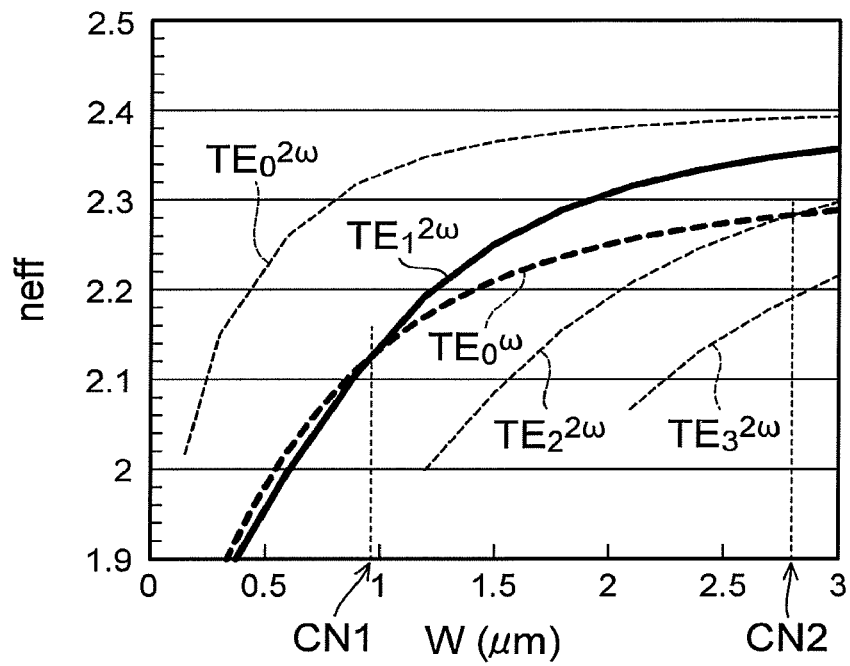
FIG. 3A and FIG. 3B are graphs illustrating characteristics of the waveguide element.
Figure 3B:
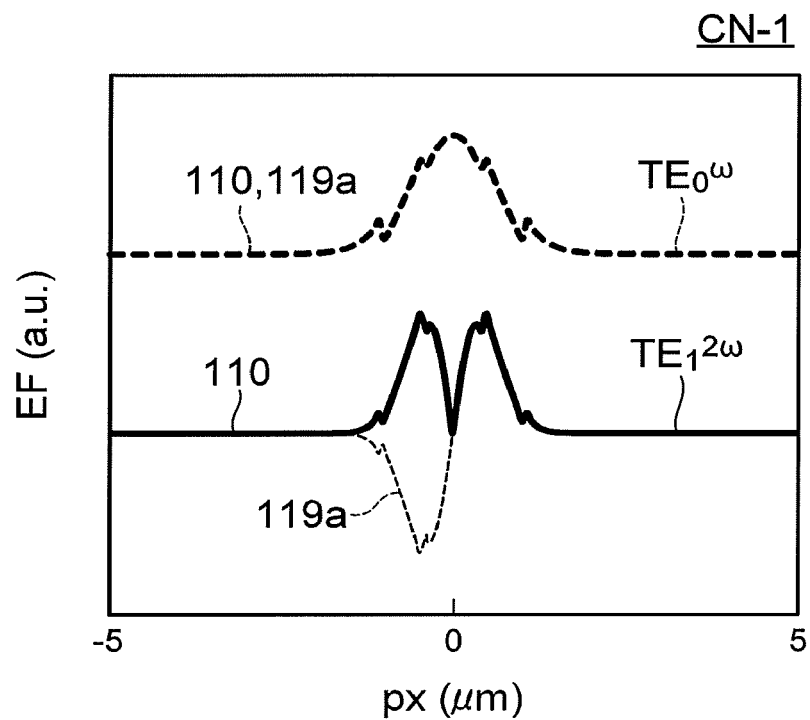

FIG. 3A and FIG. 3B are graphs illustrating characteristics of the waveguide element.

In these figures, the wavelength of the incident light (the first light L1) is 1064 nm. FIG. 3A shows an example of modal dispersion curves of the waveguide element 110. The horizontal axis of FIG. 3A is the width W (μm) of the waveguide 10. The vertical axis is an effective refractive index neff. The characteristics of the $TE_0$ mode $TE_0^\omega$ of the fundamental, the $TE_0$ mode $TE_0^{2\omega}$ of the second harmonic, the $TE_1$ mode $TE_1^{2\omega}$ of the second harmonic, the $TE_2$ mode $TE_2^{2\omega}$ of the second harmonic, and the $TE_3$ mode $TE_3^{2\omega}$ of the second harmonic are shown in FIG. 3A.

As shown in FIGS. 3A and 3B, as the width W of the waveguide 10 increases, the effective refractive indexes neff of the $TE_0$ mode $TE_0^\omega$ of the fundamental, the $TE_0$ mode $TE_0^{2\omega}$ of the second harmonic, the $TE_1$ mode $TE_1^{2\omega}$ of the second harmonic, the $TE_2$ mode $TE_2^{2\omega}$ of the second harmonic, and the $TE_3$ mode $TE_3^{2\omega}$ of the second harmonic increase. The effective refractive index neff of the $TE_0$ mode $TE_0^\omega$ of the fundamental matches the effective refractive index neff of the $TE_1$ mode $TE_1^{2\omega}$ of the second harmonic when the width W is at a first condition CN1 of about 1 μm. When the width is at such a condition, the speed of the $TE_0$ mode $TE_0^\omega$ of the fundamental matches the speed of the $TE_1$ mode $TE_1^{2\omega}$ of the second harmonic. For example, the $TE_0$ mode $TE_0^\omega$ of the fundamental is converted efficiently into the $TE_1$ mode $TE_1^{2\omega}$ of the second harmonic.

The effective refractive index neff of the $TE_0$ mode $TE_0^\omega$ of the fundamental matches the effective refractive index neff of the $TE_2$ mode $TE_2^{2\omega}$ of the second harmonic when the width W is at a second condition CN2 of about 2.7 μm. At such a condition, the speed of the $TE_0$ mode $TE_0^\omega$ of the fundamental matches the speed of the $TE_2$ mode $TE_2^{2\omega}$ of the second harmonic. For example, the $TE_0$ mode $TE_0^\omega$ of the fundamental is converted efficiently into the $TE_2$ mode $TE_2^{2\omega}$ of the second harmonic.

FIG. 3B shows an electric field intensity EF (arbitrary units) at the first condition CN1. The horizontal axis of FIG. 3B is a position px (μm) in the X-axis direction. The vertical axis is the electric field intensity EF. The electric field intensity EF of the $TE_0$ mode $TE_0^\omega$ of the fundamental and the electric field intensity EF of the $TE_1$ mode $TE_1^{2\omega}$ of the second harmonic are shown in FIG. 3B. The characteristic of the waveguide element 110 according to the embodiment and the characteristic of a waveguide element 119a of a reference example are illustrated in FIG. 3B. In the waveguide element 110, the <0001> direction of the first crystal region 11 is the +X direction; and the <0001> direction of the second crystal region 12 is the −X direction. On the other hand, in the waveguide element 119a, the <0001> direction of the first crystal region 11 is the +Y direction; and the <0001> direction of the second crystal region 12 is the −Y direction.

As shown in FIG. 3B, the electric field intensity EF of the $TE_0$ mode $TE_0^\omega$ of the fundamental of the waveguide element 110 is the same as the electric field intensity EF of the $TE_0$ mode $TE_0^\omega$ of the fundamental of the waveguide element 119a. The electric field intensity EF of the $TE_0$ mode $TE_0^\omega$ of the fundamental has an even-function characteristic for both the waveguide elements 110 and 119a.

On the other hand, the electric field intensity EF of the $TE_1$ mode $TE_1^{2\omega}$ of the second harmonic of the waveguide element 110 is different from the electric field intensity EF of the $TE_1$ mode $TE_1^{2\omega}$ of the second harmonic of the waveguide element 119a. The electric field intensity EF of the $TE_1$ mode $TE_1^{2\omega}$ of the second harmonic of the waveguide element 110 has an even-function characteristic. The electric field intensity EF of the $TE_1$ mode $TE_1^{2\omega}$ of the second harmonic of the waveguide element 119a has an odd-function characteristic.

In the waveguide element 110, when the electric field intensity EF of the $TE_0$ mode $TE_0^\omega$ of the fundamental and the electric field intensity EF of the $TE_1$ mode $TE_1^{2\omega}$ of the second harmonic are synthesized, the synthesized electric field intensity EF is intense. Conversely, in the waveguide element 119a, when the electric field intensity EF of the $TE_0$ mode $TE_0^\omega$ of the fundamental and the electric field intensity EF of the $TE_1$ mode $TE_1^{2\omega}$ of the second harmonic are synthesized, the synthesized electric field intensity EF is weak. The efficiency of the wavelength conversion is insufficient.

Thus, in the waveguide element 110 according to the embodiment, the phases of the light are matched; and the overlap integral can be increased. According to the embodiment, the wavelength can be converted with high efficiency.

For the waveguide element 110 at the second condition CN2 recited above as well, the phases of the light are matched; and the overlap integral can be increased. For the waveguide element 110 at the second condition CN2, three peaks that have the same polarity occur in the electric field intensity EF of the $TE_2$ mode $TE_2^{2\omega}$ of the second harmonic. Conversely, for the waveguide element 119a at the second condition CN2, three peaks of which the positive or negative is reversed occur in the electric field intensity EF of the $TE_2$ mode $TE_2^{2\omega}$ of the second harmonic. For the waveguide element 110 according to the embodiment at the second condition CN2 as well, the phases of the light are matched; and the overlap integral can be increased.

At the second condition CN2 and the first condition CN1 recited above, a wavelength of the incident light (the first light L1) of 1064 nm is converted into the emitted light (the second light L2) of a wavelength of 532 nm.

Figure 4A:
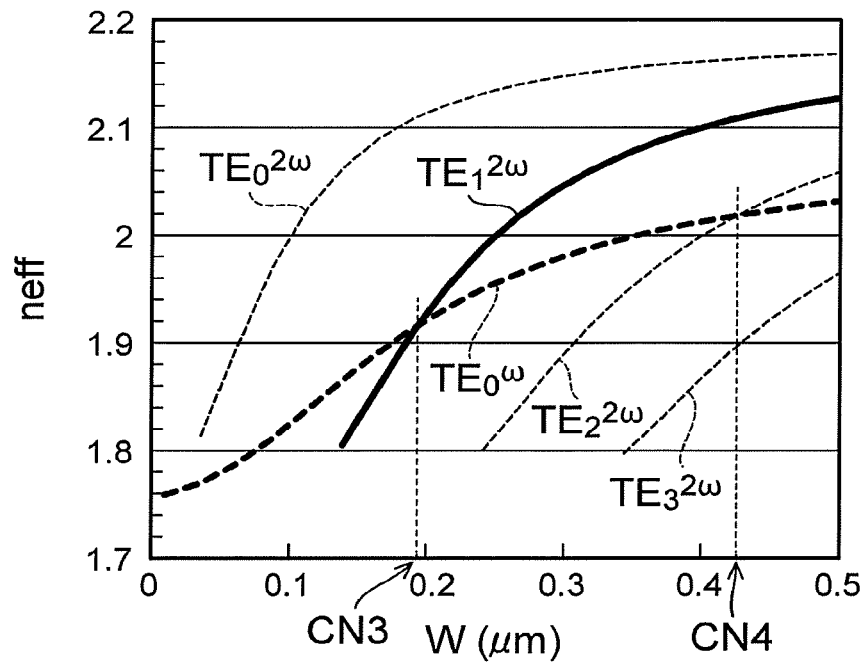
FIG. 4A and FIG. 4B are graphs illustrating characteristics of the waveguide elements.
Figure 4B:
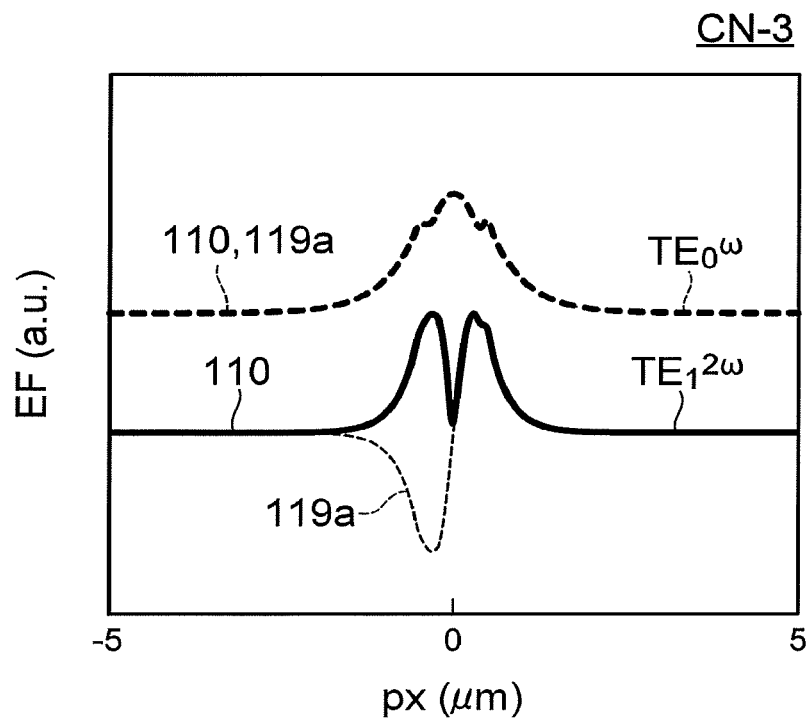

FIG. 4A and FIG. 4B are graphs illustrating characteristics of the waveguide elements.

In the example, the first crystal region 11 and the second crystal region 12 are AlN. The <0001> direction of the first crystal region 11 and the <0001> direction of the second crystal region 12 are parallel to the X-axis direction. The <0001> direction of the first crystal region 11 is from the first crystal region 11 toward the second crystal region 12. The <0001> direction of the second crystal region 12 is from the second crystal region 12 toward the first crystal region 11. The first layer 50 is a c-plane sapphire substrate. The second layer 60 is aluminum oxide ($AlO_x$).

In FIG. 4A and FIG. 4B, the wavelength of the incident light (the first light L1) is 532 nm. FIG. 4A shows an example of the modal dispersion curves of the waveguide element 110. The horizontal axis of FIG. 4A is the width W (μm) of the waveguide 10. The vertical axis is the effective refractive index neff.

When the width W is at a third condition CN3 of about 0.18 μm, the effective refractive index neff of the $TE_0$ mode $TE_0^\omega$ of the fundamental matches the effective refractive index neff of the $TE_1$ mode $TE_1^{2\omega}$ of the second harmonic. At such a condition, the speed of the $TE_0$ mode $TE_0^\omega$ of the fundamental matches the speed of the $TE_1$ mode $TE_1^{2\omega}$ of the second harmonic. For example, the $TE_0$ mode $TE_0^\omega$ of the fundamental is converted efficiently into the $TE_1$ mode $TE_1^{2\omega}$ of the second harmonic.

When the width W is at a fourth condition CN4 of about 0.42 μm, the effective refractive index neff of the $TE_0$ mode $TE_0^\omega$ of the fundamental matches the effective refractive index neff of the $TE_2$ mode $TE_2^{2\omega}$ of the second harmonic. At such a condition, the speed of the $TE_0$ mode $TE_0^\omega$ of the fundamental matches the speed of the $TE_2$ mode $TE_2^{2\omega}$ of the second harmonic. For example, the $TE_0$ mode $TE_0^\omega$ of the fundamental is converted efficiently into the $TE_2$ mode $TE_2^{2\omega}$ of the second harmonic.

FIG. 4B shows the electric field intensity EF (arbitrary units) at the third condition CN3. The horizontal axis of FIG. 3B is the position px (μm) in the X-axis direction. The vertical axis is the electric field intensity.

As shown in FIG. 4B, the electric field intensity EF of the $TE_0$ mode $TE_0^\omega$ of the fundamental of the waveguide element 110 is the same as the electric field intensity EF of the $TE_0$ mode $TE_0^\omega$ of the fundamental of the waveguide element 119a. The electric field intensity EF of the $TE_0$ mode $TE_0^\omega$ of the fundamental has an even-function characteristic for both the waveguide elements 110 and 119a. The electric field intensity EF of the $TE_1$ mode $TE_1^{2\omega}$ of the second harmonic of the waveguide element 110 has an even-function characteristic. The electric field intensity EF of the $TE_1$ mode $TE_1^{2\omega}$ of the second harmonic of the waveguide element 119a has an odd-function characteristic.

For the waveguide element 110, when the electric field intensity EF of the $TE_0$ mode $TE_0^\omega$ of the fundamental and the electric field intensity EF of the $TE_1$ mode $TE_1^{2\omega}$ of the second harmonic are synthesized, the synthesized electric field intensity EF is intense. Conversely, for the waveguide element 119a, when the electric field intensity EF of the $TE_0$ mode $TE_0^\omega$ of the fundamental and the electric field intensity EF of the $TE_1$ mode $TE_1^{2\omega}$ of the second harmonic are synthesized, the synthesized electric field intensity EF is weak.

Thus, in the waveguide element 110 according to the embodiment, the phases of the light are matched; and the overlap integral can be increased. According to the embodiment, the wavelength can be converted with high efficiency.

For the waveguide element 110 at the fourth condition CN4 recited above as well, the phases of the light are matched; and the overlap integral can be increased. At the fourth condition CN4, three peaks that have the same polarity occur in the electric field intensity EF of the $TE_2$ mode $TE_2^{2\omega}$ of the second harmonic of the waveguide element 110. Conversely, for the waveguide element 119a at the fourth condition CN4, three peaks that have different polarities occur in the electric field intensity EF of the $TE_2$ mode $TE_2^{2\omega}$ of the second harmonic. In the waveguide element 110 according to the embodiment at the fourth condition CN4 as well, the phases of the light are matched; and the overlap integral can be increased.

At the third condition CN3 and the fourth condition CN4 recited above, a wavelength of the incident light (the first light L1) of 532 nm is converted into the emitted light (the second light L2) of a wavelength of 266 nm.

At the first condition CN1 of the example shown in FIG. 3A, the wavelength of 1064 nm is converted into the wavelength of 532 nm. Conversely, at the first condition CN1, the wavelength of 532 nm may be converted into the wavelength of 1064 nm. This is because the effective refractive index neff for the wavelength of 1064 nm is the same as the effective refractive index neff for the wavelength of 532 nm at the first condition CN1. At the first condition CN1, the wavelength of 532 nm is not converted into a wavelength of 266 nm. This is because the effective refractive index neff for the wavelength of 532 nm is different from the effective refractive index neff for the wavelength of 266 nm at the first condition CN1.

On the other hand, at the third condition CN3 of the example shown in FIG. 4A, the wavelength of 532 nm is converted into the wavelength of 266 nm. Conversely, at the third condition CN3, the wavelength of 266 nm may be converted into the wavelength of 532 nm. This is because the effective refractive index neff for the wavelength of 532 nm is the same as the effective refractive index neff for the wavelength of 266 nm at the third condition CN3. At the third condition CN3, the wavelength of 532 nm is not converted into the wavelength of 1064 nm. This is because the effective refractive index neff for the wavelength of 532 nm is different from the effective refractive index neff for the wavelength of 1064 nm at the third condition CN3.

Figure 5A:
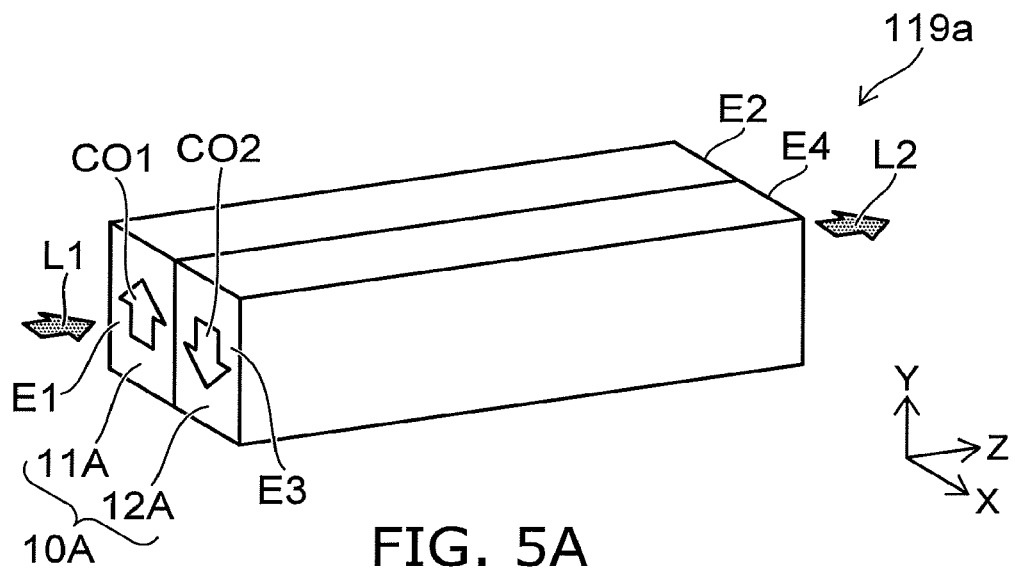
FIG. 5A to FIG. 5C are schematic perspective views showing waveguide elements of reference examples.
Figure 5B:
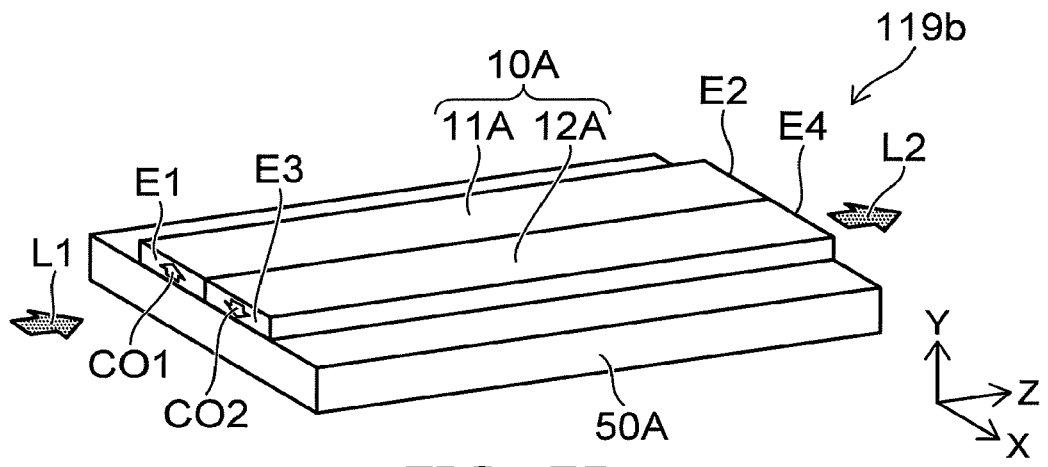
Figure 5C:
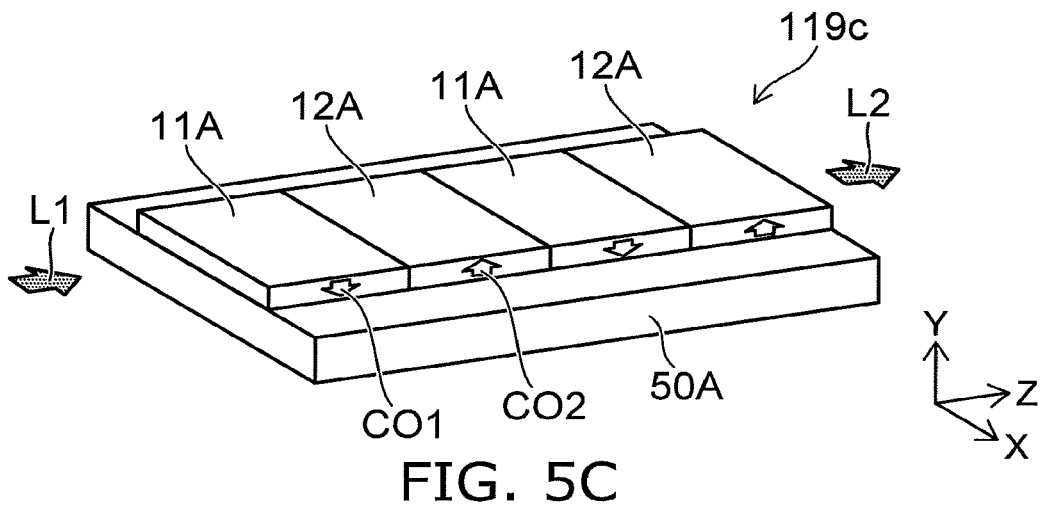

FIG. 5A to FIG. 5C are schematic perspective views showing waveguide elements of reference examples.

As shown in FIG. 5A, crystal regions 11A and 12A are provided as a waveguide 10A in the waveguide element 119a of the reference example. The direction from the crystal region 11A toward the crystal region 12A is the X-axis direction. The first orientation CO1 (e.g., the <0001> direction) of the polarity of the crystal in the crystal region 11A is the +Y direction. The second orientation CO2 (e.g., the <0001> direction) of the polarity of the crystal in the crystal region 12A is the −Y direction. In such a reference example, the efficiency of the wavelength conversion is insufficient as described in reference to FIG. 3B and FIG. 4B. Further, it is not easy to make the structure of the waveguide element 119a of the reference example.

As shown in FIG. 5B, in a waveguide element 119b of a reference example as well, the direction from the crystal region 11A toward the crystal region 12A is the X-axis direction. The first orientation CO1 (e.g., the <0001> direction) of the polarity of the crystal in the crystal region 11A is the +Y direction. The second orientation CO2 (e.g., the <0001> direction) of the polarity of the crystal in the crystal region 12A is the −Y direction. In the waveguide element 119b, two crystal regions are formed on a flat substrate 50A. For example, the crystal region 11A is formed by inheriting the crystallinity of the substrate 50A which is crystalline in a state in which a portion of the substrate 50A is masked. Subsequently, the mask is removed; and processing that reverses the polarity is performed on another portion of the exposed substrate 50A. Subsequently, the crystal region 12A is formed on the other portion. The waveguide element 119b is obtained by such a method. For example, a LiNbO$_3$ substrate or the like is used as the substrate 50A. For example, the diffusion of Ti or the like is performed as the processing that reverses the polarity. In the waveguide element 119b as well, the efficiency of the wavelength conversion is insufficient. Because the two crystal regions are formed separately, it is practically difficult for the characteristics of the two crystal regions to be the same. Considering practical crystal growth, the thicknesses of the two crystal regions are thin. Therefore, the width (the thickness) of the waveguide 10A is thin; and loss in the propagation of the light occurs easily.

In a waveguide element 119c of a reference example as shown in FIG. 5C, the crystal region 11A and the crystal region 12A are arranged alternately along the Z-axis direction. The incident light (the first light L1) alternately passes through the crystal region 11A and the crystal region 12A.

Such a configuration also can be formed by using a LiNbO$_3$ substrate, etc., and by performing processing (the diffusion of Ti, etc.) to reverse the polarizations. Or, the following method may be considered. For example, an As film is formed on a portion of a substrate that is the (100) plane of Si; and an AlGaAs layer is formed on the As film. Subsequently, a Ga film is formed on another portion of the substrate; and an AlGaAs layer is formed on the Ga film. Thereby, a structure can be formed in which the crystal region 11A and the crystal region 12A are arranged alternately along the Z-axis direction. In the crystal region 11A, the first orientation CO1 of the polarity is the +Y direction. In the crystal region 12A, the second orientation CO2 of the polarity is the −Y direction. In such a waveguide element 119c as well, it is practically difficult for the characteristics of the two crystal regions to be the same because the two crystal regions are formed separately. Considering practical crystal growth, the thicknesses of the two crystal regions are thin. Therefore, the width (the thickness) of the waveguide 10A is thin; and loss in the propagation of the light occurs easily.

The case is investigated where +c axis GaN (Ga polarity) and −c axis GaN (N polarity) are formed by applying the method for manufacturing the waveguide element 119c of the reference example. In this method, compared to the growth rate of the +c axis GaN (Ga polarity), the growth rate of the −c axis GaN (N polarity) is markedly low (slow). Therefore, fluctuation of the thickness or the period occurs easily for the +c axis GaN and the −c axis GaN. Due to such fluctuation, the phase mismatch increases; and the wavelength conversion efficiency decreases. Generally, the impurity concentration that is incorporated in the crystal growth is different between the +c axis GaN and the −c axis GaN. For example, compared to the +c axis GaN, the impurity concentration (the concentration of oxygen or carbon) is not less than 100 times higher than that of the −c axis GaN. These impurities cause the absorption of the light. Therefore, the conversion efficiency decreases. Compared to the +c axis GaN, the crystallinity decreases easily for the −c axis GaN. For example, the dislocation density of the −c axis GaN is not less than 10 times the dislocation density of the +c axis GaN. The conversion efficiency decreases due to the propagation loss due to the dislocations.

Conversely, in the method of this application, the two crystal layers are grown from the two side surfaces of the recess 50q. The two crystal layers are +c axis GaN. Thereby, a growth rate difference does not occur between the two crystal layers. Thereby, the two crystal layers are obtained in which the periods and the thicknesses are substantially equal respectively. An abrupt boundary (interface) can be formed. The incorporation of the impurity is low because the two crystal layers are formed of the +c axis GaN. The waveguide 10 that has good crystallinity is obtained. According to the embodiment, a waveguide element that has a high conversion efficiency is obtained.

The impurity includes, for example, a first element selected from the group consisting of oxygen, carbon, and silicon. In the embodiment, for example, the difference is small between the concentration (a first concentration) of the first element (the impurity) in the first crystal region 11 and the concentration (a second concentration) of the first element in the second crystal region 12. The first concentration is greater than 0.01 times but less than 100 times the second concentration. The difference between the impurity concentrations inside the two crystal regions is, for example, less than a factor of 100. The concentration of the oxygen is low and is, for example, $10^{17}/cm^3$ or less for each of the two crystal regions. The concentration of carbon is low and is, for example, $10^{17}/cm^3$ or less for each of the two crystal regions. The concentration of silicon is low and is, for example, $10^{17}/cm^3$ or less for each of the two crystal regions.

Examples of the characteristics of the waveguide element 110 according to the embodiment compared to the waveguide element 119c of the reference example will now be described.

FIG. 6A to FIG. 6G are schematic views illustrating the waveguide element according to the embodiment.

FIG. 6A is a schematic perspective view illustrating the waveguide element 110. FIG. 6B is a graph illustrating a characteristic of the waveguide element 110. FIG. 6C to FIG. 6G are graphs illustrating characteristics of the waveguide element 110.

As shown in FIG. 6A, the first crystal region 11 and the second crystal region 12 are provided in the waveguide 10 of the waveguide element 110. In the first crystal region 11, the first orientation CO1 (e.g., the <0001> direction) of the polarity of the crystal is the +X direction. In the second crystal region 12, the second orientation CO2 (e.g., the <0001> direction) of the polarity of the crystal is the –X direction. The first light L1 is incident on the waveguide 10; and the second light L2 is emitted. The first light L1 is the fundamental. The second light L2 is, for example, a SHG (second-harmonic generation) wave. The propagation direction of the light is aligned with the Z-axis direction.

The sum of the length along the X-axis direction of the first crystal region 11 and the length along the X-axis direction of the second crystal region 12 is taken as a normalized thickness Wn.

The horizontal axis of FIG. 6B is the normalized thickness Wn. The vertical axis is the effective refractive index neff. The electric field component $E^\omega$ of the fundamental and the electric field component $E^{2\omega}$ of the SHG wave increase as the normalized thickness Wn increases. When the normalized thickness Wn is at a condition CNn of about 0.18, the effective refractive indexes neff for these electric field components are the same. In other words, the speeds are the same.

As shown in FIG. 6C, the first crystal region 11 and the second crystal region 12 extend along the Z-axis direction.

In FIG. 6D to FIG. 6G, the horizontal axis is the position in the Z-axis direction. The vertical axis of FIG. 6D is the electric field component $E^\omega$ of the fundamental. The vertical axis of FIG. 6E shows the second-order nonlinear polarization $P^{2\omega}$. A component P11 and a component P12 are shown in FIG. 6E. In FIG. 6F and FIG. 6G, the vertical axis is the electric field component $E^{2\omega}$ of the SHG wave.

As shown in FIG. 6D, the fundamental of the speed $c^\omega$ is incident on the waveguide 10 (the first crystal region 11 and the second crystal region 12). As shown in FIG. 6E, by providing the first crystal region 11 and the second crystal region 12 in the waveguide 10, the polarity of the negative component of the second-order nonlinear polarization $P^{2\omega}$ is reversed. Thereby, both the component P11 and the component P12 are positive. As described above, at the condition CNn, the speed $c^{2\omega}$ of the SHG wave is the same as the speed $c^\omega$ of the fundamental. Therefore, as shown in FIG. 6F, the phase of the electric field component $E^{2\omega}$ of the SHG wave matches the phase of the electric field component $E^\omega$ of the fundamental. As shown in FIG. 6F and FIG. 6G, for example, all of the phases match; and amplification is performed.

In the waveguide element 110 according to the embodiment, the light of which the wavelength is converted is amplified by using the two crystal regions of which the polarities of the crystals are reversed. A highly efficient wavelength conversion is obtained using a simple configuration.

In the embodiment, the phases are matched. The overlap integral of the electric field intensity distribution of the $TE_0$ mode of the fundamental (the incident light) and the electric field intensity distribution of the $TE_1$ mode of the second harmonic increases. A highly efficient wavelength conversion is possible. For example, visible light can be converted into ultraviolet with a high efficiency.

FIG. 7A to FIG. 7G are schematic views illustrating a waveguide element of a reference example.

Figure 7A:
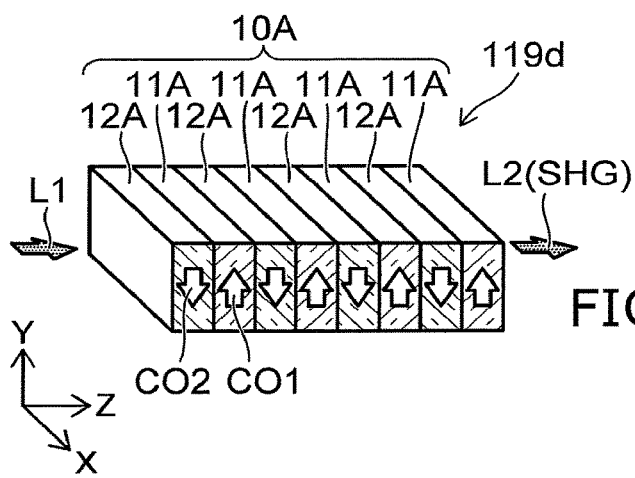
FIG. 7A to FIG. 7G are schematic views illustrating a waveguide element of a reference example.
Figure 7B:
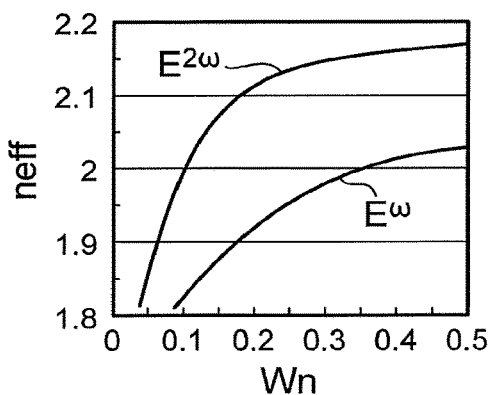

FIG. 7A is a schematic perspective view illustrating the waveguide element 119d of the reference example. FIG. 7B is a graph illustrating a characteristic of the waveguide element 119d. FIG. 7C to FIG. 7G are graphs illustrating characteristics of the waveguide element 119d.

In the waveguide element 119d as shown in FIG. 7A, the crystal region 11A and the crystal region 12A are provided alternately along the Z-axis direction in the waveguide 10A. In the crystal region 11A, the first orientation CO1 of the polarity of the crystal is the +Y direction. In the crystal region 12A, the second orientation CO2 of the polarity of the crystal is the –Y direction. The first light L1 (the fundamental) is incident on the waveguide 10A; and the second light L2 (the SHG wave) is emitted. The propagation direction of the light is aligned with the Z-axis direction. The lengths along the Y-axis direction of the crystal region 11A and the crystal region 12A are taken as the normalized thickness Wn.

In the waveguide element 119d as shown in FIG. 7B, the effective refractive index neff for the electric field component $E^\omega$ of the fundamental does not match the effective refractive index neff for the electric field component $E^{2\omega}$ of the SHG wave. The speed of the SHG wave is not the same as the speed of the fundamental.

Figure 7C:
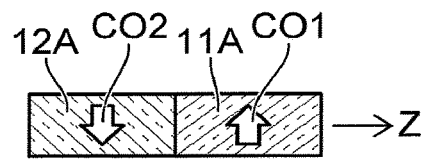

As shown in FIG. 7C, the crystal region 11A and the crystal region 12A are arranged along the Z-axis direction.

Figure 7D:
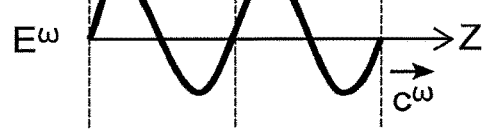
Figure 7E:
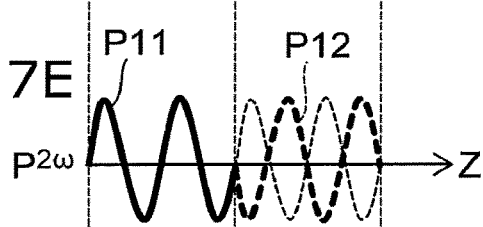
Figure 7F:
Figure 7G:

As shown in FIG. 7D, the fundamental of the speed $c^\omega$ is incident on the waveguide 10A (the crystal region 11A and the crystal region 12A). As shown in FIG. 7E, the polarity of the second-order nonlinear polarization $P^{2\omega}$ in the crystal region 12A is reversed with respect to the polarity of the second-order nonlinear polarization $P^{2\omega}$ in the crystal region 11A. The phase in the crystal region 12A is shifted with respect to the phase in the crystal region 11A. The speed $c^{2\omega}$ of the SHG wave is not the same as the speed $c^\omega$ of the fundamental. Therefore, even in the case where the phases of a portion of the components match, the phases of the other components do not match. Therefore, in the waveguide element 119d, the efficiency of the wavelength conversion cannot be sufficiently high.

Figure 8:
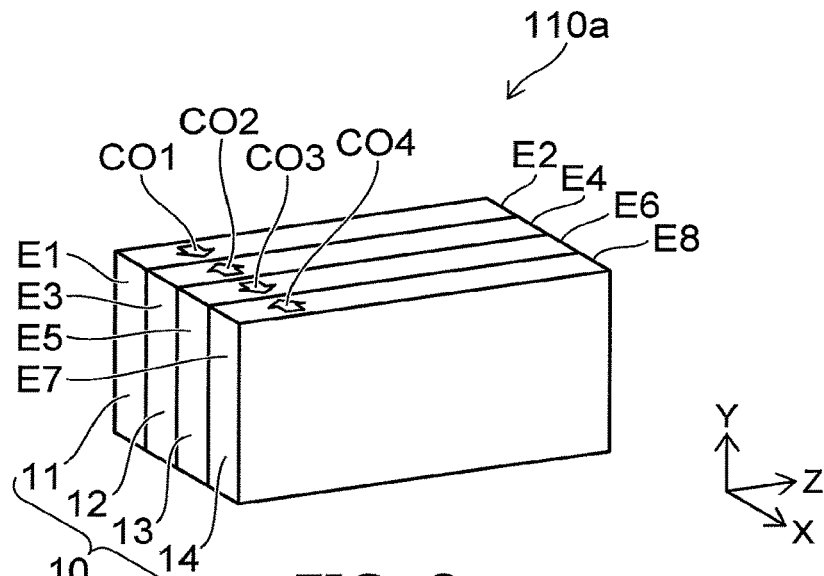
FIG. 8 is a schematic perspective view illustrating another waveguide element according to the first embodiment.

FIG. 8 is a schematic perspective view illustrating another waveguide element according to the first embodiment.

As shown in FIG. 8, the waveguide element 110a according to the embodiment further includes a third crystal region 13 and a fourth crystal region 14 in addition to the first crystal region 11 and the second crystal region 12. For example, the waveguide element 110a can be formed by the method described in reference to FIG. 2F.

The third crystal region 13 extends in the first direction (the Z-axis direction) and includes a third nitride semiconductor. The fourth crystal region 14 extends in the first direction and includes a fourth nitride semiconductor. For example, the fourth crystal region 14 is continuous with the third crystal region 13. For example, the third crystal region 13 is continuous with the second crystal region 12.

The second crystal region 12 is positioned between the first crystal region 11 and the fourth crystal region 14 in the second direction (the X-axis direction). The third crystal region 13 is positioned between the second crystal region 12 and the fourth crystal region 14 in the second direction.

A third orientation CO3 of the polarity of the third crystal region 13 and a fourth orientation CO4 of the polarity of the fourth crystal region 14 are aligned with the second direction (the X-axis direction). The third orientation CO3 is the reverse of the fourth orientation CO4. The third orientation CO3 is the same as the first orientation CO1. The fourth orientation CO4 is the same as the second orientation CO2.

The <0001> direction of the third crystal region 13 is from the third crystal region 13 toward the fourth crystal region 14. The <0001> direction of the fourth crystal region 14 is from the fourth crystal region 14 toward the third crystal region 13. The <0001> direction of the third crystal region 13 is from the first crystal region 11 toward the second crystal region 12. The <0001> direction of the fourth crystal region 14 is from the second crystal region 12 toward the first crystal region 11.

The third crystal region 13 includes a fifth end portion E5 and a sixth end portion E6. The direction from the fifth end portion E5 toward the sixth end portion E6 is aligned with the first direction (the Z-axis direction). The fourth crystal region 14 includes a seventh end portion E7 and an eighth end portion E8. The direction from the seventh end portion E7 toward the eighth end portion E8 is aligned with the first direction. In such a case, the first light L1 is incident on the fifth end portion E5 and the seventh end portion E7 in addition to the first end portion E1 and the third end portion E3.

Thus, a set in which the orientations of the crystals are mutually-reversed may be multiply provided. A wavelength conversion that has even higher efficiency can be performed.
Second Embodiment The embodiment relates to a light-emitting device. The light-emitting device includes a light source portion and the waveguide element (and modifications of the waveguide element) according to the first embodiment. The waveguide element 110 is used in the following example.

Figure 9:
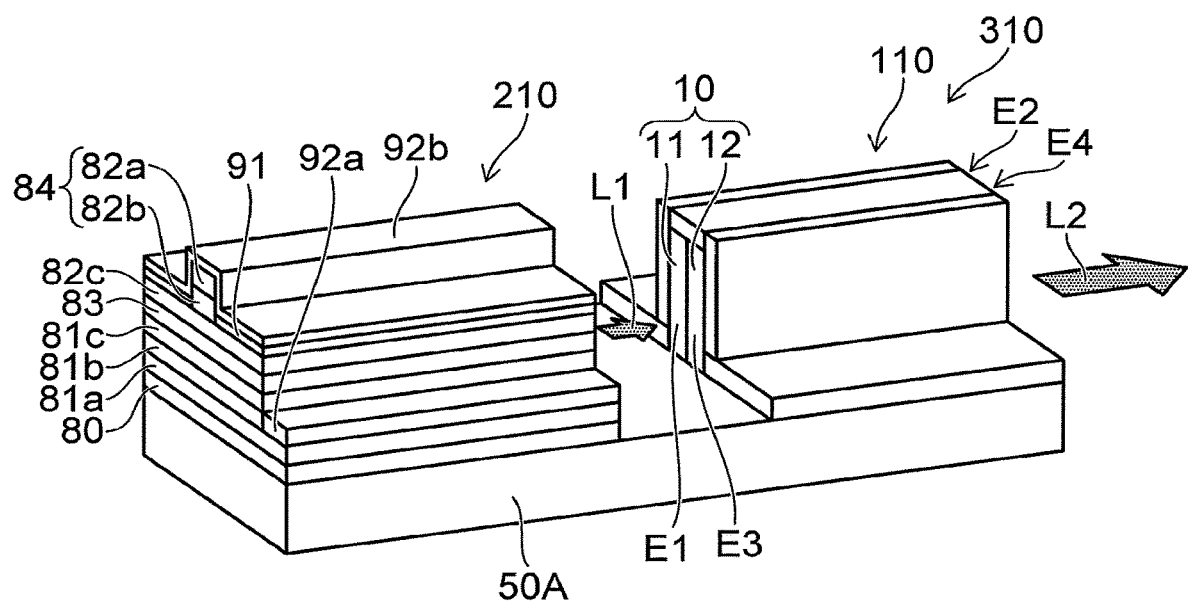
FIG. 9 is a schematic perspective view illustrating the waveguide element according to the second embodiment.

FIG. 9 is a schematic perspective view illustrating the waveguide element according to the second embodiment.

As shown in FIG. 9, the light-emitting device 310 according to the embodiment includes the waveguide element 110 and a light source portion 210. The light source portion 210 emits the first light L1 of the first wavelength.

As described above, the first crystal region 11 includes the first end portion E1 and the second end portion E2. The direction from the first end portion E1 toward the second end portion E2 is aligned with the first direction (the Z-axis direction). The second crystal region 12 includes the third end portion E3 and the fourth end portion E4. The direction from the third end portion E3 toward the fourth end portion E4 is aligned with the first direction. The first light L1 is incident on the first end portion E1 and the third end portion E3. The second wavelength of the second light L2 that is emitted from the second end portion E2 and the fourth end portion E4 is different from the first wavelength. The first wavelength is substantially 2 times the second wavelength.

For example, the first wavelength is not less than 400 nanometers and not more than 900 nanometers. For example, the second wavelength is not less than 200 nanometers and not more than 450 nanometers.

For example, the waveguide element 110 and the light source portion 210 are provided on the substrate 50A. A portion of the substrate 50A may be used as the first layer 50.

The light source portion 210 is, for example, a semiconductor light-emitting element. The light source portion 210 is, for example, a laser. The light source portion 210 is, for example, an InGaN laser. The wavelength of the light (the first light L1) emitted from the light source portion 210 is, for example, 520 nm. The second wavelength of the second light L2 obtained by the wavelength conversion is, for example, 260 nm.

The light source portion 210 includes a first semiconductor layer 81, a light-emitting layer 83, a second semiconductor layer 82, an insulating film 91, a first electrode 92a, and a second electrode 92b. A buffer layer 80 is provided in the example. The buffer layer 80 is provided between the substrate 50A and the second electrode 92b. The first semiconductor layer 81 is provided between the buffer layer 80 and the second electrode 92b. The light-emitting layer 83 is provided between the first semiconductor layer 81 and the second electrode 92b. The second semiconductor layer 82 is provided between the light-emitting layer 83 and the second electrode 92b. The first semiconductor layer 81 includes a contact layer 81a, a clad layer 81b, and a guide layer 81c. The second semiconductor layer 82 includes a contact layer 82a, a clad layer 82b, and a guide layer 82c. A ridge portion 84 is provided between a portion of the guide layer 82c and a portion of the second electrode 92b. The ridge portion 84 includes the contact layer 82a and the clad layer 82b.

The first semiconductor layer 81 includes, for example, a nitride semiconductor (e.g., n-type GaN) of a first conductivity type (e.g., the n-type). The contact layer 81a includes, for example, n-type GaN. The clad layer 81b includes, for example, n-type AlGaN. The guide layer 81c includes, for example, n-type InGaN. The second semiconductor layer 82 includes, for example, a nitride semiconductor (e.g., p-type GaN) of a second conductivity type (e.g., the p-type). The contact layer 82a includes, for example, p-type GaN. The clad layer 82b includes, for example, p-type AlGaN. The guide layer 82c includes, for example, p-type InGaN. The light-emitting layer 83 includes, for example, InGaN. The refractive index of the clad layer 81b is lower than the refractive index of the guide layer 81c. The refractive index of the clad layer 82b is lower than the refractive index of the guide layer 82c.

In the embodiment, for example, the waveguide element 110 and the light source portion 210 of the InGaN laser are formed in a monolith on the substrate 50A. Thereby, a high-efficiency micro-size light-emitting device can be provided.

In the light-emitting device 310 illustrated in FIG. 9, the waveguide element 110a (referring to FIG. 8) and the light source portion 210 may be combined. In such a case, the first light L1 is incident on the fifth end portion E5 and the seventh end portion E7 in addition to the first end portion E1 and the third end portion E3.

FIG. 10A to FIG. 10F are schematic views illustrating other waveguide elements according to the second embodiment.

Figure 10A:
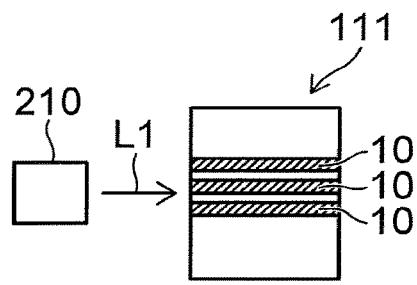
FIG. 10A to FIG. 10F are schematic views illustrating other waveguide elements according to the second embodiment.

As shown in FIG. 10A, the multiple waveguides 10 are provided in a waveguide element 111. In such a waveguide element 111, the first light L1 enters from the light source portion 210. In the example, the multiple waveguides 10 are separated from each other.

Figure 10B:
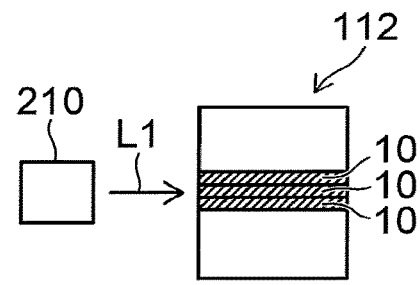

As shown in FIG. 10B, the multiple waveguides 10 are provided in a waveguide element 112 as well. In such a waveguide element 112, the first light L1 enters from the light source portion 210. In the example, the multiple waveguides 10 contact each other.

Figure 10C:
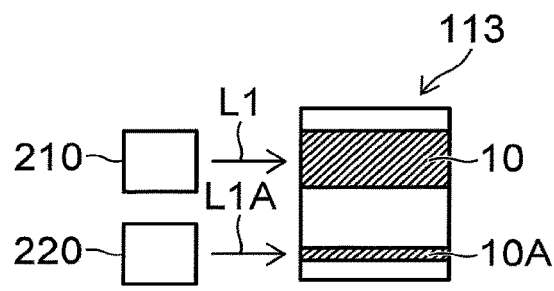

As shown in FIG. 10C, the waveguide 10 and the other waveguide 10A are provided in a waveguide element 113 as well. The configurations of these waveguides are different from each other. Another light source portion 220 is provided in addition to the light source portion 210. The light (the first light L1 and another first light L1A) that are emitted from these light source portions are different from each other. For example, the wavelengths are different from each other. Such multiple configurations may be provided on one substrate 50A.

Figure 10D:
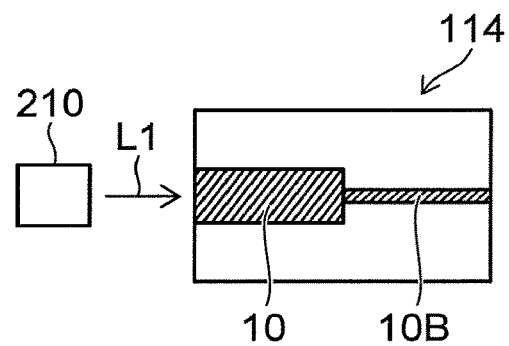

As shown in FIG. 10D, the waveguide 10 and another waveguide 10B are provided in a waveguide element 114. The other waveguide 10B is continuous with the waveguide 10. The light that propagates through one of these waveguides passes through the other one of these waveguides. The configurations of these waveguides are different from each other. For example, the light that undergoes wavelength conversion by the waveguide 10 undergoes further wavelength conversion by the other waveguide 10B. For example, the fourth harmonic of the first light L1 can be generated. The first light L1 from one light source portion 210 is incident on the waveguide.

Figure 10E:
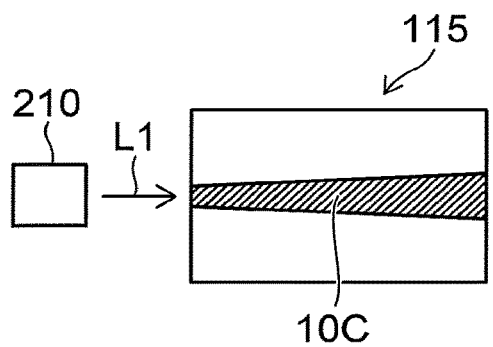

In a waveguide element 115 as shown in FIG. 10E, the width of a waveguide 10C (the length of the waveguide 10C along a direction crossing the direction in which the waveguide 10 extends) changes along the extension direction. In the example, the width in the region distal to the light source portion 210 is wider than the width in the region proximal to the light source portion 210. By such a configuration, for example, the range of the wavelengths of the light that undergo the wavelength conversion can be enlarged.

Figure 10F:
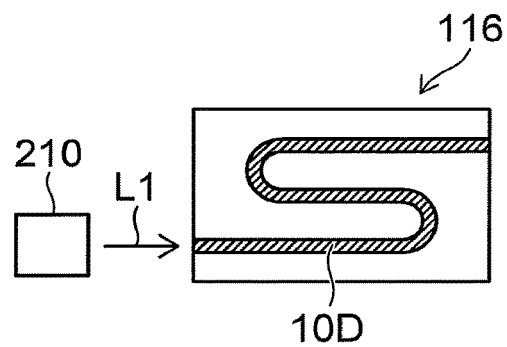

As shown in FIG. 10F, a waveguide 10D is bent in a waveguide element 116. The waveguide 10D is bent. By such a configuration, for example, the waveguide length can be long; and the conversion efficiency can be increased.

Thus, various modifications are possible for the waveguide and the light source portion.

Third Embodiment

An embodiment relates to a method for manufacturing the waveguide element. The manufacturing method includes, for example, at least a portion of the processing described in reference to FIG. 2A to FIG. 2F.

The manufacturing method includes a process of preparing the first layer 50 that is crystalline (referring to FIG. 2A). The first layer 50 has the recess 50q extending in the first direction (e.g., the Z-axis direction). The recess 50q has the first side surface 51 and the second side surface 52. The first side surface 51 and the second side surface 52 oppose each other in the second direction (e.g., the X-axis direction) crossing the first direction.

The manufacturing method includes a process of growing the first crystal layer 11c including a nitride semiconductor from the first side surface 51, and growing the second crystal layer 12c including a nitride semiconductor from the second side surface 52 (referring to FIG. 2C).

The manufacturing method includes forming the first crystal region 11 including the first crystal layer 11c and the second crystal region 12 including the second crystal layer 12c to cause the first crystal layer 11c and the second crystal layer 12c to contact each other (referring to FIG. 2D).

By such a manufacturing method, a waveguide element can be manufactured in which the efficiency can be increased.

Fourth Embodiment

In the first embodiment recited above, the first crystal region 11 and the second crystal region 12 include nitride semiconductors. In a fourth embodiment, the first crystal region 11 and the second crystal region 12 may include a material other than a nitride semiconductor. Otherwise, the fourth embodiment is similar to the first embodiment.

The waveguide element (e.g., the waveguide element 110 illustrated in FIG. 1A to FIG. 1C, etc.) according to the fourth embodiment includes the first crystal region 11 and the second crystal region 12. The first crystal region 11 extends in the first direction. The second crystal region 12 extends in the first direction and is continuous with the first crystal region 11. The second direction from the first crystal region 11 toward the second crystal region 12 crosses the first direction. The first orientation CO1 of the polarity of the first crystal region 11 and the second orientation CO2 of the polarity of the second crystal region 12 are aligned with the second direction. The first orientation CO1 is the reverse of the second orientation CO2.

In the fourth embodiment as well, the waveguide element (e.g., the waveguide element 110a illustrated in FIG. 8) may further include the third crystal region 13 and the fourth crystal region 14. The third crystal region 13 extends in the first direction. The fourth crystal region 14 extends in the first direction and is continuous with the third crystal region 13. The second crystal region 12 is positioned between the first crystal region 11 and the fourth crystal region 14 in the second direction. The third crystal region 13 is positioned between the second crystal region 12 and the fourth crystal region 14 in the second direction. The third orientation CO3 of the polarity of the third crystal region 13 and the fourth orientation CO4 of the polarity of the fourth crystal region 14 are aligned with the second direction. The third orientation CO3 is the same as the first orientation CO1. The fourth orientation CO4 is the same as the second orientation.

For example, the third crystal region 13 may be continuous with the second crystal region 12.

The first to fourth crystal regions 11 to 14 recited above include, for example, at least one selected from SiC, ZnO, ZnSe, GaP, GaAsP, AlGaInP, AlGaAs, and GaAs.

According to the waveguide element according to the fourth embodiment as well, a waveguide element and a light-emitting device can be provided in which the efficiency can be increased.

For example, wavelength conversion technology that utilizes a nonlinear optical effect is used as a method for widening the wavelength region of the laser into deep ultraviolet, mid-infrared, etc. For example, a phase matching method that utilizes the birefringence of a ferroelectric material is utilized as a wavelength conversion method. A quasi-phase matching method is used as technology for compensating the mismatch of the phases by using the spatial modulation structure of the nonlinear optical constant. A compound semiconductor has a large second-order nonlinear constant. The compound semiconductor can be used as the wavelength conversion material. For example, there is a method for periodically modulating the polarizations for quasi-phase matching by the compound semiconductor. However, for example, in the case of modulating the polarization by using the crystal orientation, the optimal crystal growth conditions are different between the crystal orientations; therefore, differences occur easily between the sizes of the polarization regions and the quality of the crystals; and the wavelength conversion efficiency decreases easily.

In the embodiment, two crystal regions that have good optical characteristics can be manufactured stably.

The second-order nonlinear optical effect is represented by $P\omega3(2)=\varepsilon0\chi(2)(\omega3: \omega1, \omega2)E\omega1E\omega2$. Here, P(2) is the second-order nonlinear polarization. $\varepsilon0$ is the dielectric constant of a vacuum. χ(2) is the second-order nonlinear susceptibility. E is the optical electric field. Nonlinear polarization occurs due to the interaction between the nonlinear medium and the incident light of the angular frequencies ω1 and ω2. Light of the angular frequency ω3 (ω3=ω1±ω2) that is different from that of the incident light is obtained. In other words, the wavelength is converted.

In the waveguide element according to the embodiment, for example, wavelength conversion that uses a second-order nonlinear optical effect can be utilized. The wavelength conversion that uses the second-order nonlinear optical effect includes at least one of, for example, second-harmonic generation (SHG), sum-frequency generation (SFG), difference-frequency generation (DFG), or optical parametric generation•oscillation (OPO).

The embodiments may include the following configurations.

Configuration 1

A waveguide element, comprising:

a first crystal region extending in a first direction and including a first nitride semiconductor; and a second crystal region extending in the first direction, including a second nitride semiconductor, and being continuous with the first crystal region, a second direction from the first crystal region toward the second crystal region crossing the first direction, a <0001> direction of the first crystal region being from the first crystal region toward the second crystal region, a <0001> direction of the second crystal region being from the second crystal region toward the first crystal region.

Configuration 2

The waveguide element according to Configuration 1, wherein the first direction is aligned with an m-axis direction of the first crystal region and aligned with an m-axis direction of the second crystal region.

Configuration 3

The waveguide element according to Configuration 1 or 2, wherein the first crystal region includes a first portion and a second portion, the second portion is positioned between the first portion and the second crystal region, a dislocation density of the second portion is lower than a dislocation density of the first portion, the second crystal region includes a third portion and a fourth portion, the fourth portion is positioned between the third portion and the first crystal region, and a dislocation density of the fourth portion is lower than a dislocation density of the third portion.

Configuration 4

The waveguide element according to one of Configurations 1 to 3, wherein a first concentration of a first element included in the first crystal region is greater than 0.01 times but less than 100 times a second concentration of the first element included in the second crystal region, and the first element is one selected from the group consisting of oxygen, carbon, and silicon.

Configuration 5

The waveguide element according to one of Configurations 1 to 4, wherein a length along the second direction of the first crystal region is not less than 0.9 times and not more than 1.1 times a length along the second direction of the second crystal region.

Configuration 6

The waveguide element according to one of Configurations 1 to 4, wherein a sum of a length along the second direction of the first crystal region and a length along the second direction of the second crystal region is not less than 0.1 times and not more than 2 times a length of the first crystal region along a third direction crossing a plane including the first direction and the second direction.

Configuration 7

The waveguide element according to one of Configurations 1 to 4, wherein a length along the first direction of the first crystal region is longer than a length along the second direction of the first crystal region, and a length along the first direction of the second crystal region is longer than a length along the second direction of the second crystal region.

Configuration 8

The waveguide element according to Configuration 7, wherein the length along the first direction of the first crystal region is longer than a length along the third direction of the first crystal region, the length along the first direction of the second crystal region is longer than a length along the third direction of the second crystal region, and the third direction crosses a plane including the first direction and the second direction.

Configuration 9

The waveguide element according to one of Configurations 1 to 7, further comprising a first layer including a first partial region, a second partial region, a third partial region, and a fourth partial region, at least a portion of the first crystal region being positioned between the first partial region and the second partial region in the second direction, at least a portion of the second crystal region being positioned between the second partial region and the at least a portion of the first crystal region in the second direction, a direction from the third partial region toward the first crystal region being aligned with a third direction crossing a plane including the first direction and the second direction, a direction from the fourth partial region toward the second crystal region being aligned with the third direction.

Configuration 10

The waveguide element according to Configuration 9, wherein the first layer includes at least one selected from the group consisting of aluminum oxide, silicon, aluminum nitride, and silicon carbide.

Configuration 11

The waveguide element according to Configuration 9, wherein a refractive index of the first layer is lower than a refractive index of the first crystal region and lower than a refractive index of the second crystal region.

Configuration 12

The waveguide element according to one of Configurations 9 to 11, further comprising a second layer including a fifth partial region, a sixth partial region, a seventh partial region, and an eighth partial region, a refractive index of the second layer being lower than a refractive index of the first crystal region and lower than a refractive index of the second crystal region, another portion of the first crystal region being positioned between the fifth partial region and the sixth partial region in the second direction, another portion of the second crystal region being positioned between the sixth partial region and the other portion of the first crystal region in the second direction, a direction from the first crystal region toward the seventh partial region being aligned with the third direction, a direction from the second crystal region toward the eighth partial region being aligned with the third direction.

Configuration 13

The waveguide element according to Configuration 12, wherein the first crystal region and the second crystal region include $Al_{x1}Ga_{1-x1}N(0 \le x1 < 1)$, and the second layer includes $Al_{x2}Ga_{1-x2}N(0 < x2 \le 1$ and $x1 < x2)$.

Configuration 14 The waveguide element according to Configuration 12, wherein the second layer includes at least one selected from the group consisting of silicon oxide, zinc oxide, silicon nitride, silicon oxynitride, and aluminum oxide.

Configuration 15

The waveguide element according to one of Configurations 1 to 14, further comprising:

a third crystal region extending in the first direction and including a third nitride semiconductor; and a fourth crystal region extending in the first direction, including a fourth nitride semiconductor, and being continuous with the third crystal region, the second crystal region being positioned between the first crystal region and the fourth crystal region in the second direction, the third crystal region being positioned between the second crystal region and the fourth crystal region in the second direction, a <0001> direction of the third crystal region being from the third crystal region toward the fourth crystal region, a <0001> direction of the fourth crystal region being from the fourth crystal region toward the third crystal region.

Configuration 16

The waveguide element according to Configuration 15, wherein the third crystal region is continuous with the second crystal region.

Configuration 17

The waveguide element according to one of Configurations 1 to 16, wherein the first crystal region and the second crystal region include $Al_{x1}Ga_{1-x1}N(0 \le x1 \le 1)$.

Configuration 18

A light-emitting device, comprising:

the waveguide element according to any one of Configurations 1 to 14; and a light source portion emitting a first light of a first wavelength, the first crystal region including a first end portion and a second end portion, a direction from the first end portion toward the second end portion being aligned with the first direction, the second crystal region including a third end portion and a fourth end portion, a direction from the third end portion toward the fourth end portion being aligned with the first direction, the first light being incident on the first end portion and the third end portion, a second wavelength of a second light emitted from the second end portion and the fourth end portion being different from the first wavelength.

Configuration 19

The light-emitting device according to Configuration 18, wherein the first wavelength is substantially 2 times the second wavelength.

Configuration 20

The light-emitting device according to Configuration 18 or 19, wherein the first wavelength is not less than 400 nanometers and not more than 900 nanometers, and the second wavelength is not less than 200 nanometers and not more than 450 nanometers.

Configuration 21

The light-emitting device according to one of Configurations 18 to 20, wherein the waveguide element further includes:

a third crystal region extending in the first direction and including a third nitride semiconductor; and a fourth crystal region extending in the first direction, including a fourth nitride semiconductor, and being continuous with the third crystal region, the second crystal region being positioned between the first crystal region and the fourth crystal region in the second direction, the third crystal region being positioned between the second crystal region and the fourth crystal region in the second direction, a <0001> direction of the third crystal region being from the third crystal region toward the fourth crystal region, a <0001> direction of the fourth crystal region being from the fourth crystal region toward the third crystal region, the third crystal region including a fifth end portion and a sixth end portion, a direction from the fifth end portion toward the sixth end portion being aligned with the first direction, the fourth crystal region including a seventh end portion and an eighth end portion, a direction from the seventh end portion toward the eighth end portion being aligned with the first direction, the first light being incident on the fifth end portion and the seventh end portion.

Configuration 22

The light-emitting device according to Configuration 21, wherein the third crystal region is continuous with the second crystal region.

Configuration 23

A waveguide element, comprising:

a first crystal region extending in a first direction; and a second crystal region extending in the first direction and being continuous with the first crystal region, a second direction from the first crystal region toward the second crystal region crossing the first direction, a first orientation of a polarity of the first crystal region and a second orientation of a polarity of the second crystal region being aligned with the second direction, the first orientation being the reverse of the second orientation.

Configuration 24

The waveguide element according to Configuration 23, further comprising:

a third crystal region extending in the first direction; and a fourth crystal region extending in the first direction and being continuous with the third crystal region, the second crystal region being positioned between the first crystal region and the fourth crystal region in the second direction, the third crystal region being positioned between the second crystal region and the fourth crystal region in the second direction, a third orientation of a polarity of the third crystal region and a fourth orientation of a polarity of the fourth crystal region being aligned with the second direction, the third orientation being the same as the first orientation,
the fourth orientation being the same as the second orientation.

Configuration 25

The waveguide element according to Configuration 24, wherein the third crystal region is continuous with the second crystal region.

Configuration 26

A method for manufacturing a waveguide element, comprising:

preparing a first layer having a recess and being crystalline, the recess extending in a first direction and having a first side surface and a second side surface opposing each other in a second direction crossing the first direction; and growing a first crystal layer from the first side surface and growing a second crystal layer from the second side surface, the first crystal layer including a nitride semiconductor, the second crystal layer including a nitride semiconductor; and forming a first crystal region and a second crystal region by causing the first crystal layer and the second crystal layer to contact each other, the first crystal region including the first crystal layer, the second crystal region including the second crystal layer.

According to the embodiments, a waveguide element, a light-emitting device, and a method for manufacturing a waveguide element can be provided in which the efficiency can be increased.

In the specification, "nitride semiconductor" includes all compositions of semiconductors of the chemical formula $B_x In_y Al_z Ga_{1-x-y-z} N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in waveguide elements such as crystal regions, a first layer, a second layer, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all waveguide elements and light-emitting devices practicable by an appropriate design modification by one skilled in the art based on the waveguide elements and the light-emitting devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A waveguide element, comprising:
   a first crystal region extending in a first direction and including a first nitride semiconductor; and
   a second crystal region extending in the first direction, including a second nitride semiconductor, being continuous with the first crystal region, and being immediately adjacent to the first crystal region, wherein
   a second direction crossing the first direction is from the first crystal region toward the second crystal region, and
   a polarity of the first crystal region opposes a polarity of the second crystal region.

2. The element according to claim 1, wherein the first direction is aligned with an m-axis direction of the first crystal region and aligned with an m-axis direction of the second crystal region.

3. The element according to claim 1, wherein
   the first crystal region includes a first portion and a second portion,
   the second portion is positioned between the first portion and the second crystal region,
   a dislocation density of the second portion is lower than a dislocation density of the first portion,
   the second crystal region includes a third portion and a fourth portion,
   the fourth portion is positioned between the third portion and the first crystal region, and
   a dislocation density of the fourth portion is lower than a dislocation density of the third portion.

4. The element according to claim 1, wherein
   a first concentration of a first element included in the first crystal region is greater than 0.01 times but less than 100 times a second concentration of the first element included in the second crystal region, and
   the first element is one selected from the group consisting of oxygen, carbon, and silicon.

5. The element according to claim 1, wherein a length along the second direction of the first crystal region is not less than 0.9 times and not more than 1.1 times a length along the second direction of the second crystal region.

6. The element according to claim 1, wherein a sum of a length along the second direction of the first crystal region and a length along the second direction of the second crystal region is not less than 0.1 times and not more than 2 times a length of the first crystal region along a third direction crossing a plane including the first direction and the second direction.

7. The element according to claim 1, wherein
   a length along the first direction of the first crystal region is longer than a length along the second direction of the first crystal region, and
   a length along the first direction of the second crystal region is longer than a length along the second direction of the second crystal region.

8. The element according to claim 7, wherein
the length along the first direction of the first crystal region is longer than a length along a third direction of the first crystal region,
the length along the first direction of the second crystal region is longer than a length along the third direction of the second crystal region, and
the third direction crosses a plane including the first direction and the second direction.

9. The element according to claim 1, further comprising a first layer including a first partial region, a second partial region, a third partial region, and a fourth partial region, wherein
at least a portion of the first crystal region is positioned between the first partial region and the second partial region in the second direction,
at least a portion of the second crystal region is positioned between the second partial region and the at least a portion of the first crystal region in the second direction,
a direction from the third partial region toward the first crystal region is aligned with a third direction crossing a plane including the first direction and the second direction, and
a direction from the fourth partial region toward the second crystal region is aligned with the third direction.

10. The element according to claim 9, wherein the first layer includes at least one selected from the group consisting of aluminum oxide, silicon, aluminum nitride, and silicon carbide.

11. The element according to claim 9, wherein a refractive index of the first layer is lower than a refractive index of the first crystal region and lower than a refractive index of the second crystal region.

12. The element according to claim 9, further comprising a second layer including a fifth partial region, a sixth partial region, a seventh partial region, and an eighth partial region, wherein
a refractive index of the second layer is lower than a refractive index of the first crystal region and lower than a refractive index of the second crystal region,
another portion of the first crystal region is positioned between the fifth partial region and the sixth partial region in the second direction,
another portion of the second crystal region is positioned between the sixth partial region and the other portion of the first crystal region in the second direction,
a direction from the first crystal region toward the seventh partial region is aligned with the third direction, and
a direction from the second crystal region toward the eighth partial region is aligned with the third direction.

13. The element according to claim 12, wherein
the first crystal region and the second crystal region include $Al_{x1}Ga_{1-x1}N(0 \le x1 < 1)$, and
the second layer includes $Al_{x2}Ga_{1-x2}N(0 < x2 \le 1$ and $x1 < x2)$.

14. The element according to claim 12, wherein the second layer includes at least one selected from the group consisting of silicon oxide, zinc oxide, silicon nitride, silicon oxynitride, and aluminum oxide.

15. The element according to claim 1, further comprising:
a third crystal region extending in the first direction and including a third nitride semiconductor; and
a fourth crystal region extending in the first direction, including a fourth nitride semiconductor, and being continuous with the third crystal region, wherein
the second crystal region is positioned between the first crystal region and the fourth crystal region in the second direction,
the third crystal region is positioned between the second crystal region and the fourth crystal region in the second direction, and
a polarity of the third crystal region opposes a polarity of the fourth crystal region.

16. The element according to claim 15, wherein the third crystal region is continuous with the second crystal region.

17. The element according to claim 1, wherein the first crystal region and the second crystal region include $Al_{x1}Ga_{1-x1}N(0 \le x1 \le 1)$.

18. A light-emitting device, comprising:
the waveguide element according to claim 1; and
a light source portion emitting a first light of a first wavelength, wherein
the first crystal region includes a first end portion and a second end portion, a direction from the first end portion toward the second end portion being aligned with the first direction,
the second crystal region includes a third end portion and a fourth end portion, a direction from the third end portion toward the fourth end portion being aligned with the first direction,
the first light is incident on the first end portion and the third end portion, and
a second wavelength of a second light emitted from the second end portion and the fourth end portion is different from the first wavelength.

19. The device according to claim 18, wherein
the waveguide element further includes:
a third crystal region extending in the first direction and including a third nitride semiconductor; and
a fourth crystal region extending in the first direction, including a fourth nitride semiconductor, and being continuous with the third crystal region,
the second crystal region is positioned between the first crystal region and the fourth crystal region in the second direction,
the third crystal region is positioned between the second crystal region and the fourth crystal region in the second direction,
a polarity of the third crystal region opposes a polarity of the fourth crystal region,
the third crystal region includes a fifth end portion and a sixth end portion, a direction from the fifth end portion toward the sixth end portion being aligned with the first direction,
the fourth crystal region includes a seventh end portion and an eighth end portion, a direction from the seventh end portion toward the eighth end portion being aligned with the first direction, and
the first light is incident on the fifth end portion and the seventh end portion.

* * * * *